(12) United States Patent
Okamura et al.

(10) Patent No.: US 7,679,272 B2
(45) Date of Patent: Mar. 16, 2010

(54) MULTI-LAYER PIEZOELECTRIC ELEMENT

(75) Inventors: Takeshi Okamura, Kirishima (JP);
Katsushi Sakaue, Kirishima (JP);
Mitsuo Kondo, Kirishima (JP)

(73) Assignee: Kyocera Corporation, Kyoto (JP)

( * ) Notice: Subject to any disclaimer, the term of this patent is extended or adjusted under 35 U.S.C. 154(b) by 332 days.

(21) Appl. No.: 10/573,339

(22) PCT Filed: Sep. 22, 2004

(86) PCT No.: PCT/JP2004/013796
§ 371 (c)(1),
(2), (4) Date: Jan. 10, 2007

(87) PCT Pub. No.: WO2005/031887
PCT Pub. Date: Apr. 7, 2005

(65) Prior Publication Data
US 2007/0205700 A1     Sep. 6, 2007

(30) Foreign Application Priority Data
Sep. 25, 2003 (JP) ............................. 2003-333112
Nov. 18, 2003 (JP) ............................. 2003-388420
Dec. 17, 2003 (JP) ............................. 2003-420167

(51) Int. Cl.
*H01L 41/08* (2006.01)
(52) U.S. Cl. ..................................... 310/358; 252/62.9
(58) Field of Classification Search ................. 310/358; 252/62.9 PZ
See application file for complete search history.

(56) References Cited

U.S. PATENT DOCUMENTS

| 4,626,369 | A  |   | 12/1986 | Walker, Jr. |
| 5,279,996 | A  | * | 1/1994  | Hase et al. ............. 501/136 |
| 5,504,388 | A  |   | 4/1996  | Kimura et al. |
| 6,312,816 | B1 | * | 11/2001 | Roeder et al. ............. 428/432 |
| 6,414,417 | B1 |   | 7/2002  | Tsuyoshi et al. |

(Continued)

FOREIGN PATENT DOCUMENTS

JP       61-133715       6/1986

(Continued)

OTHER PUBLICATIONS

European Search Report for corresponding European application No. 04787979.6-2222 lists the references above.

(Continued)

*Primary Examiner*—Mark Budd
(74) *Attorney, Agent, or Firm*—Hogan & Hartson LLP

(57) ABSTRACT

To provide a multi-layer piezoelectric device having excellent durability in which the amount of displacement does not change even when the piezoelectric actuator is subjected to continuous operation over a long period of time under a high voltage and a high pressure, the multi-layer piezoelectric device comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while content of alkali metal in a range from 5 ppm to 300 ppm is contained.

2 Claims, 3 Drawing Sheets

U.S. PATENT DOCUMENTS

| | | | |
|---|---|---|---|
| 6,440,324 B1 * | 8/2002 | Hayashi et al. | 252/62.9 PZ |
| 6,511,763 B1 * | 1/2003 | Kida et al. | 428/699 |
| 6,573,639 B1 | 6/2003 | Heinz et al. | |

FOREIGN PATENT DOCUMENTS

| | | |
|---|---|---|
| JP | 1-130568 | 9/1989 |
| JP | 05-194016 | 8/1993 |
| JP | 06-100364 | 4/1994 |
| JP | 2001-342062 | 12/2001 |
| JP | 2002208743 A | 7/2002 |
| JP | 2002-220281 | 8/2002 |
| JP | 2003-008092 | 1/2003 |
| JP | 2003-017768 | 1/2003 |
| JP | 2003-197991 | 7/2003 |
| WO | 0148834 A2 | 7/2001 |
| WO | 01/93345 | 12/2001 |

OTHER PUBLICATIONS

English translation of Chinese office action for corresponding Chinese application 200480027651.4 lists the reference above.

* cited by examiner

MULTI-LAYER PIEZOELECTRIC ELEMENT

TECHNICAL FIELD

The present invention relates to a multi-layer piezoelectric device and injection apparatus, for example, fuel injection apparatus of automobile engine, liquid injection apparatus of ink jet printer or the like or a drive unit used in precision positioning device or vibration preventing device for an optical apparatus, and to a multi-layer piezoelectric device used as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like.

BACKGROUND ART

Multi-layer piezoelectric actuators constituted from piezoelectric layers and internal electrodes stacked alternately one on another have been known as an example of the multi-layer piezoelectric device. The multi-layer piezoelectric actuators can be divided into two categories: fired-at-once type and stacked type which has such a constitution as piezoelectric porcelain and internal electrode sheets are stacked one on another alternately. When the requirements to reduce the operating voltage and the manufacturing cost are taken into consideration, the multi-layer piezoelectric actuator of fired-at-once type is more advantageous for the reason of smaller layer thickness and higher durability.

FIG. 2 shows a multi-layer piezoelectric device of the prior art disclosed in Patent Document 1, which is constituted from a stack 200, that is formed by stacking piezoelectric layers 21 and internal electrodes 22 alternately one on another, and external electrodes 23 formed on a pair of side faces that oppose each other. While the stack 200 is formed by stacking the piezoelectric layers 21 and the internal electrodes 22 alternately one on another, the internal electrodes 22 are not formed over the entire principal surfaces of the piezoelectric layers 21, but have a so-called partial electrode structure. The piezoelectric layers are stacked in the so-called partial electrode structure such that the internal electrode 22 is placed in every other layer in a staggered manner so as to be exposed alternately at the left then at the right on different side faces of the stack 200. Inactive layers 24, 24 are stacked on both principal surfaces of the stack 200 in the direction of stacking. Then the external electrodes 23 are formed so that the internal electrodes 22 that are exposed on the pair of opposing side faces of the stack 200 are connected to each other, thereby connecting the internal electrodes 22 in every other layer.

In case the multi-layer piezoelectric device of the prior art is used as a piezoelectric actuator, lead wires are soldered onto the external electrodes 23 and operated by applying a predetermined voltage between the external electrodes 23. In recent years, since it is required to make a compact multi-layer piezoelectric device capable of achieving a large amount of displacement under a high pressure, it is in practice to carry out continuous operation over a long period of time with a higher electric field applied.

The multi-layer piezoelectric device is manufactured as follows. First, an internal electrode paste is printed in the pattern of a predetermined electrode structure as shown in FIG. 2 on a ceramic green sheet that contains the material of the piezoelectric layer 21, stacking a plurality of the green sheets coated with the internal electrode paste so as to form a multi-layer compact and firing the compact thereby to make the stack 200. Then the external electrodes 23 are formed on a pair of side faces of the stack 200 by firing, thereby to make the multi-layer piezoelectric device.

During manufacture of the stack 200 of the prior art, alkali metal may mix into the material. That is, the stock material mixed into the green sheet of the piezoelectric layer 21 and the binder may contain an alkali metal in the form of oxide, carbonate or nitrate, or may mix as an inevitable impurity. While a glass powder may be added to the stock material of the piezoelectric layer 21 for the purpose of improving the ease of sintering thereof, the glass powder often contains oxides of alkali metals. Moreover, the alkali metal may also mix into the material from crushing balls used in crushing the stock material to make the piezoelectric layer 21 or from the firing atmosphere through diffusion.

Halogen elements may also mix into the material. That is, the stock material used to make the piezoelectric layer 21 and the binder may include halogen elements in the form of fluoride, chloride, bromide, iodide or astatine compound, or mixing therein as an inevitable impurity. Also in the manufacturing process, use of water during crushing or storage of the stock material used to make the piezoelectric layer 21 over a long period of time may lead to mixing of halogen elements into the material. Moreover, halogen elements may also mix into the material from crushing balls used in crushing the stock material of the piezoelectric layer 21 or from the firing atmosphere through diffusion.

The alkali metals and halogen elements may also mix into the material in the form of compounds such as NaCl from human bodies.

The internal electrode 22 has been formed from an alloy of silver and palladium and, in order to fire the piezoelectric layers 21 and the internal electrodes 22 at the same time, composition of metals contained in the internal electrode 22 has been set to 70% by weight of silver and 30% by weight of palladium (refer to, for example, Patent Document 2).

The internal electrode is made of metal compound that contains silver-palladium alloy instead of pure silver because, when a voltage is applied between the pair of opposing electrodes that are made of silver without palladium content, the so-called silver migration occurs in which silver atoms migrate from the positive electrode to the negative electrode of the pair of the electrodes along the device surface. Silver migration occurs conspicuously particularly in an atmosphere of high temperature and high humidity.

During manufacture of the internal electrodes 22, alkali metal may mix into the internal electrodes 22. That is, the stock material of the internal electrodes 22 and the binder may include alkali metal in the form of oxide, carbonate or nitrate, or mix therein as an inevitable impurity. While a glass powder may be added to the stock material of the internal electrodes 22 for the purpose of improving the ease of sintering, the glass powder often contains oxides of alkali metals. Moreover, alkali metal may also mix into the material from crushing balls used in crushing the stock material of the internal electrodes 22 or from the firing atmosphere through diffusion.

Halogen elements may also mix into the internal electrodes 22. That is, the stock material used to make the internal electrodes 22 and the binder may include halogen elements in the form of fluoride, chloride, bromide, iodide or astatine compound, or mix into the material as an inevitable impurity. Also in the manufacturing process, storage of the stock material used of the internal electrodes 22 over a long period of time may lead to mixing of halogen elements into the material. Moreover, halogen elements may also mix into the material from the firing atmosphere through diffusion.

Both the alkali metals and halogen elements may also mix into the material in the form of compounds such as NaCl from human bodies.

During manufacture of the external electrodes 23 of the prior art, alkali metal may mix into the external electrodes 23. That is, the stock material of the external electrodes 23 and the binder may include alkali metal in the form of oxide, carbonate or nitrate, or mix therein as an inevitable impurity. While a glass powder may be added to the stock material of the external electrodes 23 for the purpose of improving the ease of sintering, the glass powder often contains oxides of alkali metals. Moreover, alkali metal may also mix into the material from crushing balls used in crushing the stock material of the external electrodes 23 or from the firing atmosphere through diffusion.

Halogen elements may also mix into the external electrodes 23. That is, the stock material used to make the external electrodes 23 and the binder may include halogen elements in the form of fluoride, chloride, bromide, iodide or astatine compound, or mix into the material as an inevitable impurity. Also in the manufacturing process, use of water in the mixing and crushing process or storage of the stock material used of the external electrodes 23 over a long period of time may lead to mixing of halogen elements into the material. Moreover, halogen elements may also mix into the material from crushing balls used in crushing the stock material of the external electrodes 23 or from the firing atmosphere through diffusion.

Both the alkali metals and halogen elements may also mix into the material in the form of compounds such as NaCl from human bodies.

When the multi-layer piezoelectric device is manufactured by firing the stack constituted from a plurality of the green sheets formed from the stock material of the piezoelectric layer 21 and the binder whereon the paste constituted from the stock material of the internal electrodes 22 and the binder is printed thereon, the alkali metal contained in the piezoelectric layer 21 and in the internal electrodes 22 may diffuse from a portion of higher concentration of alkali metal into a portion of lower concentration. Distance over which the diffusion propagates varies depending on the firing temperature, duration of firing and the ratio of concentrations. The halogen element contained in the piezoelectric layer 21 and in the internal electrodes 22 may also diffuse from a portion of higher concentration of halogen element into a portion of lower concentration. Distance over which the diffusion propagates varies depending on the firing temperature, duration of firing and the ratio of concentrations.

Also when the paste constituted from the stock material of the external electrodes 23 and the binder is printed and fired on the pair of side faces of the stack 200, alkali metals contained in the external electrodes 23 and in the piezoelectric layer 21 that is in contact with the external electrodes 23 may diffuse from a portion of higher concentration of alkali metal into a portion of lower concentration. Distance over which the diffusion propagates varies depending on the firing temperature, duration of firing and the ratio of concentrations. In addition, alkali metals contained in the external electrodes 23 and in the internal electrodes 22 that is in contact with the external electrodes 23 may diffuse from a portion of higher concentration of alkali metal into a portion of lower concentration. Distance over which the diffusion propagates varies depending on the firing temperature, duration of firing and the ratio of concentrations.

Similarly, halogen element contained in the external electrodes 23 and in the piezoelectric layer 21 that is in contact with the external electrodes 23 may also diffuse from a portion of higher concentration of the halogen element into a portion of lower concentration. Distance over which the diffusion propagates varies depending on the firing temperature, duration of firing and the ratio of concentrations. Similarly, halogen element contained in the external electrodes 23 and in the internal electrode 22 that is in contact with the external electrodes 23 may also diffuse from a portion of higher concentration of the halogen element into a portion of lower concentration. Distance over which the diffusion propagates varies depending on the firing temperature, duration of firing and the ratio of concentrations.

Alkali metals are very effective in assisting the sintering reaction of ceramics materials, and have long been used as the sintering assisting agent. However, excessive amount of alkali metal results in dielectric loss of high frequency energy. Therefore, it has been a common practice to decrease the content of alkali metal in order to decrease the dielectric loss in ceramic materials used in IC packages which suffer increasing transmission loss of signals when the dielectric loss of high frequency energy increases, and capacitors which suffer decreasing Q value and increasing heat generation when the dielectric loss of high frequency energy increases. In the multi-layer piezoelectric device, in contrast, the device is driven with a high DC voltage and operates at a low frequency of 1 kHz or less, unlike the applications described above. Therefore, high frequency dielectric characteristic is not of high priority for the multi-layer piezoelectric device. Since it has been required to form the piezoelectric layer 21 from a dense sintered material in order to achieve high insulation with regards to high voltage, alkali metal has been used as the sintering assisting agent.

Composite perovskite type compound containing $PbTiO_3$—$PbZrO_3$ (hereinafter abbreviated as PZT) as the main component has been used as ceramic or piezoelectric ceramic material. Most of the components of these materials are ceramic materials, which are formed by forming the stock material or calcined powder into a compact of predetermined shape and firing the compact at a high temperature. These piezoelectric ceramic materials have been made so as to provide various properties for such applications as actuator, ceramic filter and piezoelectric buzzer, by adjusting the proportions of the components. For example, a piezoelectric actuator consumes less power and generates less heat than the conventional electromagnetic actuator of the prior art made from a magnetic material with a coil wound around thereof, and has excellent properties such as fast response, larger amount of displacement, smaller size and smaller weight. However, PZT ceramics has drawbacks such as low 4-point bending strength that is about 100 MPa and susceptibility to cracks and breakage during machining.

Patent Document 3 discloses PZT piezoelectric ceramics that contains 0.01 to 0.3% by weight of Fe, 0.01 to 0.04% by weight of Al and 0.01 to 0.04% by weight of Si as auxiliary components for the purpose of suppressing cracks and breakage from occurring during machining with a grinder.

With the PZT piezoelectric ceramics disclosed in Patent Document 1, Al and Si added as the auxiliary components tend to form liquid phase in the sintering process, resulting in a glass phase that contains $PbO$—$Al_2O_3$—$SiO_2$ in the grain boundary after the sintering process. Accordingly, a dense sintered material can be made with crystal grains grown therein at a temperature lower than that for sintering a piezoelectric ceramic material that does not include such auxiliary components. As a result, crack and breakage can be suppressed from occurring during machining with a grinder and the glass phase has higher rupture toughness than the perovskite type compound, thus increasing the rupture toughness of the sintered material.

Multi-layer piezoelectric actuators constituted from piezoelectric layers and internal electrodes stacked alternately one on another have been known as an example of the multi-layer piezoelectric device. The multi-layer piezoelectric actuators can be divided into two categories: fired-at-once type and stacked type in which piezoelectric porcelain and internal electrode sheets are stacked one on another alternately. When the requirements to reduce the operating voltage and the manufacturing cost are taken into consideration, the multi-layer piezoelectric actuator of fired-at-once type is more advantageous for the reason of smaller layer thickness and higher durability.

Patent Document 1: Japanese Unexamined Patent Publication (Kokai) No. 61-133715
Patent Document 2: Japanese Unexamined Utility Model Publication (Kokai) No. 1-130568
Patent Document 3: Japanese Unexamined Patent Publication (Kokai) No. 14-220281

DISCLOSURE OF THE INVENTION

Problems to be Solved by the Invention

However, the multi-layer piezoelectric device used in an environment of high temperature and high pressure has such a problem that, when temperature of the multi-layer piezoelectric device rises, two impurities contained in the multi-layer piezoelectric device are ionized thereby causing a change in the specific resistance of the multi-layer piezoelectric device that in turn changes the amount of displacement.

Accordingly, when the conventional multi-layer piezoelectric device is used in such an application as fuel injection apparatus for automobile engine over a long period of time, there is a problem that the amount of displacement gradually changes and causes malfunction of the apparatus to occur. Therefore, it has been called for to suppress the amount of displacement from changing and improve durability during continuous operation over a long period of time.

There has also been such a problem that the amount of displacement of a piezoelectric material varies as the temperature changes, and therefore volumetric expansion of the internal electrode occurs when the device temperature rises, thus causing the amount of displacement of a piezoelectric actuator to change. A change in the amount of displacement during operation of the actuator, in turn, causes fluctuation in the load on the power source that supplies the voltage, thus placing a burden on the power source. When the amount of displacement undergoes a rapid change, not only the amount of displacement deteriorates rapidly but also the heat generated by the device exceeds the heat that can be removed by dissipation and thermal excursion occurs, thus resulting in breakage and failure.

In recent years, such a practice has been becoming common that a piezoelectric actuator is installed in an injection apparatus and is operated continuously over an extended period of time with an electric field of higher intensity being applied thereto, in order to obtain a larger displacement under a high pressure. However, when a high electric field is applied to the piezoelectric actuator, the junction between the internal electrode and the external electrode undergoes significant localized heating due to pinching of the path of electrical conduction. This results in a decrease in the capability of the piezoelectric actuator to expand and contract, thus making it difficult to operate the injection apparatus based on the piezoelectric actuator continuously over a long period of time.

There has been a demand for an internal electrode that has lower specific resistance, in order to keep the device temperature from rising. However, the silver-palladium alloy has specific resistance higher than that of pure silver or pure palladium, and the silver-palladium alloy having composition of 70% by weight of silver and 30% by weight of palladium shows specific resistance 1.5 times that of pure palladium. In addition, resistance of an internal electrode made by sintering with a lower density becomes even higher.

The piezoelectric ceramics disclosed in Patent Document 3 has a problem of chronic change in the volumetric specific resistance, which results in low reliability and low durability. Reliability and durability are important factors for the piezoelectric ceramics used in such applications as piezoelectric actuator installed in a vehicle.

There are also such problems as fall-off of grains that results in poor surface roughness during machining or ultrasonic cleaning of the piezoelectric ceramics, and damages affecting not only the surface but also the crystal grains located inside, thus compromising the durability.

The present invention has been made to solve the problems described above, and has an object of providing a multi-layer piezoelectric device having excellent durability in which the amount of displacement does not change even when the piezoelectric actuator is subjected to continuous operation over a long period of time under a high voltage and a high pressure.

Another object of the present invention is to provide a piezoelectric ceramic material having excellent durability that does not experience insulation breakdown even when subjected to continuous operation over a long period of time under a high voltage and a high pressure, and a multi-layer piezoelectric device using the same.

Means For Solving The Problems

The inventors of the present application conducted a research to make a multi-layer piezoelectric device that can be used without undergoing a change in the amount of displacement with excellent durability, and obtained the following findings.

First finding is that the amount of displacement changes when alkali metal is contained as an impurity in a concentration beyond a certain level in the piezoelectric layer 21 that has a composition where alkali metal is not a main component. That is, more alkali metal atoms exist in the form of ion in the piezoelectric layer that has a composition where alkali metal is not a main component. When a voltage is applied to the external electrodes of multi-layer piezoelectric device made of such a material, and especially the actuator is operated with a high DC voltage, the alkali metal ions migrate between the internal electrodes. Continuous operation over a long period of time under this condition is considered to cause the specific resistance of the multi-layer piezoelectric device to change, thus resulting in decreasing amount of displacement.

When the alkali metal ions are concentrated locally, in particular, localized short-circuiting between the internal electrodes may occur, thus interrupting the operation. Possibility of the short-circuiting becomes higher when operated in an environment of high temperature and high humidity.

The problem of alkali metal is not limited to the content thereof in the piezoelectric layer. In case alkali metal is contained in the internal electrode, when a voltage is applied to the external electrodes of the multi-layer piezoelectric device, and especially the actuator is operated with a high DC voltage, the alkali metal ions migrate from the internal electrode that serves as a positive electrode through the piezoelectric layer to the internal electrode that serves as a negative electrode. This phenomenon is considered to cause the specific resistance of the multi-layer piezoelectric device to change, thus resulting in decreasing amount of displacement. Moreover, in case alkali metal is contained in the external electrode, when a voltage is applied to the external electrodes of the multi-layer piezoelectric device, and especially the actuator is operated with a high DC voltage, the alkali metal ions migrate from the external electrode that serves as a positive electrode through the internal electrode that serves as a positive electrode or the piezoelectric layer to the internal electrode that serves as a negative electrode, thereby to cause the specific resistance of the multi-layer piezoelectric device to change, thus resulting in decreasing amount of displacement.

Thus there has been the problem of the migration of the alkali metal ions in various positions, thereby to cause the specific resistance of the multi-layer piezoelectric device to change, thus resulting in decreasing amount of displacement. While the migration of the alkali metal ions occurs through diffusion of the alkali metal ions from a position of higher concentration of alkali metal ions to a position of lower concentration, a voltage applied from the outside causes selective migration to the negative electrode that has opposite polarity to the alkali metal ion.

Second finding is that, in case the piezoelectric layer contains halogen element as an impurity, the change in the amount of displacement occurs when the halogen atoms exist in the form of ion in the piezoelectric layer. That is, when a voltage is applied to the external electrodes of the multi-layer piezoelectric device, and especially the actuator is operated with a high DC voltage, the halogen elements are ionized and metal ions migrate as the electrolyte component, thus causing the specific resistance of the multi-layer piezoelectric device to change, and resulting in decreasing amount of displacement. When this phenomenon becomes conspicuous, migration of metals contained in the internal electrode and in the external electrode is accelerated and localized short-circuiting between the internal electrodes may occur, thus interrupting the operation. Possibility of the short-circuiting becomes higher when operated in an environment of high temperature and high humidity.

The problem described above is not limited to a case where halogen element is contained in the piezoelectric layer. When ionized halogen elements such as chlorine combine with moisture contained in the atmosphere and generate electrolyte component in the internal electrode and in the external electrode, it has an effect similar to that of hydrochloric acid to corrode the electrodes and cause spark when a high voltage is applied to the device. The metal that constitutes the electrode may also dissolve in the form of ion into the electrolyte component so as to form a precipitate from the metal that constitutes the electrode and the halogen element that may cause insulation failure and eventually shutting down the operation. Furthermore, in case halogen element is contained in the internal electrode, when a voltage is applied to the external electrodes of multi-layer piezoelectric device, and especially the device is operated with a high DC voltage, the halogen ions migrate from the internal electrode that serves as a negative electrode through the piezoelectric layer to the internal electrode that serves as a positive electrode. This phenomenon is considered to cause the specific resistance of the multi-layer piezoelectric device to change, thus resulting in decreasing amount of displacement. Moreover, in case halogen element is contained in the external electrode, when a voltage is applied to the external electrodes of multi-layer piezoelectric device, and especially the actuator is operated with a high DC voltage, the halogen ions migrate from the external electrode that serves as a negative electrode through the internal electrode that serves as a negative electrode or the piezoelectric layer to the internal electrode that serves as a positive electrode, thereby to cause the specific resistance of the multi-layer piezoelectric device to change, thus resulting in decreasing amount of displacement.

Thus there has been the problem of the migration of the halogen ions in various positions, thereby to cause the specific resistance of the multi-layer piezoelectric device to change, thus resulting in decreasing amount of displacement, or when ionized halogen elements such as chlorine combine with moisture contained in the atmosphere and generate electrolyte component, it may cause spark when a high voltage is applied to the device, or the metal that constitutes the electrode may also dissolve in the form of ion into the electrolyte component so as to form a precipitate from the metal that constitutes the electrode and the halogen element that may cause insulation failure and eventually shutting down the operation. While the migration of the halogen ions occurs through diffusion of the halogen ions from a portion of higher concentration of halogen ions to a portion of lower concentration, a voltage applied from the outside causes selective migration to the positive electrode that has opposite polarity to the halogen ion.

When the problem of containing alkali metal and the problem of containing halogen element take place simultaneously, the effects of both problems appear and, at the same time, when moisture deposits on the surface of the multi-layer piezoelectric device, ionized alkali metal forms electrolyte component that may cause spark under a high voltage applied to the device and a salt to be formed when the electrolyte component is dried. As a result, the internal electrode 22 and the external electrode 23 are corroded and cause insulation failure and eventually shutting down the operation.

First multi-layer piezoelectric device of the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while content of alkali metal in a range from 5 ppm to 300 ppm is contained.

In the first multi-layer piezoelectric device of the present invention, the piezoelectric layer may include alkali metal in a concentration from 5 ppm to 500 ppm and the internal electrode may include alkali metal in a concentration from 5 ppm to 500 ppm. Also in the first multi-layer piezoelectric device of the present invention, the external electrode may include alkali metal in a concentration from 5 ppm to 500 ppm.

In the first multi-layer piezoelectric device of the present invention, the alkali metal may be at least one kind of Na and K.

The first multi-layer piezoelectric device of the present invention may further include halogen element in a concentration from 5 ppm to 1000 ppm.

When the concentration of alkali metal contained as an impurity in the first multi-layer piezoelectric device of the present invention is limited within the range described above, presence of alkali metal ions in the piezoelectric layer, in the internal electrode and in the external electrode is restricted. This makes it possible to maintain the temperature of the multi-layer piezoelectric device constant even when the piezoelectric actuator is subjected to continuous operation over a long period of time under a high voltage and a high pressure, thus preventing the amount of displacement from changing. As a result, the multi-layer piezoelectric device having excellent durability and high reliability that can suppress malfunction of the device free and short-circuiting from occurring, and an injection apparatus using the same can be provided.

Second multi-layer piezoelectric device of the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while content of halogen element in a range from 5 ppm to 1000 ppm is contained.

In the second multi-layer piezoelectric device of the present invention, the piezoelectric layer may include halogen in a concentration from 5 ppm to 1500 ppm and the internal electrode may include halogen element in a concentration from 5 ppm to 1500 ppm.

Also in the second multi-layer piezoelectric device of the present invention, the external electrode may include halogen element in a concentration from 5 ppm to 1500 ppm. Also in the second multi-layer piezoelectric device of the present invention, the halogen element may be at least one kind of Cl and Br.

When the concentration of halogen element contained as an impurity in the second multi-layer piezoelectric device of the present invention is limited within the range described above, ionization of halogen element in the piezoelectric layer, in the internal electrode and in the external electrode is restricted. This makes it possible to maintain the temperature of the multi-layer piezoelectric device constant even when the piezoelectric actuator is subjected to continuous operation over a long period of time under a high voltage and a high pressure, thus preventing the amount of displacement from changing. As a result, the multi-layer piezoelectric device having excellent durability and high reliability that can suppress malfunction of the device and short-circuiting from occurring, and an injection apparatus using the same can be provided.

The same effect as described above can be achieved also in case the alkali metal and halogen element are contained together.

Third multi-layer piezoelectric device of the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while the ratio of change in the device dimension after undergoing $1 \times 10^9$ cycles of continuous operation to the initial device dimension is not larger than 1%.

In the third multi-layer piezoelectric device of the present invention, the ratio of change in thickness of the internal electrode after undergoing $1 \times 10^9$ cycles of continuous operation to the initial thickness of the internal electrode is not larger than 5%.

The third multi-layer piezoelectric device of the present invention does not experience substantial change in the amount of displacement after continuous operation, and therefore has excellent durability and is free from malfunction of the device and thermal excursion.

In the third multi-layer piezoelectric device of the present invention, when the ratio of change in thickness of the internal electrode after continuous operation is set within 5%, the ratio of change in the device dimension can be kept within 1%, thus achieving similar effect.

In the first through third multi-layer piezoelectric devices of the present invention, it is preferable to add an inorganic component along with the metallic component in the internal electrode. This increases the bonding strength between the internal electrode and the piezoelectric layer, thereby preventing the internal electrode and the piezoelectric layer from coming off each other. It is preferable that the inorganic component contains perovskite type oxide consisting of $PbZrO_3$—$PbTiO_3$ as the main component.

In the first through third multi-layer piezoelectric devices of the present invention, it is preferable the piezoelectric layer contains perovskite type oxide as the main component.

When the piezoelectric layer contains perovskite type oxide consisting of $PbZrO_3$—$PbTiO_3$ as the main component, the piezoelectric layer and the internal electrode can be fired at the same time, and therefore the firing process can be reduced in time and specific resistance of the internal electrode can be decreased.

Firing temperature of the stack is preferably in a range from 900 to 1000° C.

When the deviation in the composition of the internal electrode that is caused by the firing operation is kept within 5%, the internal electrode that can deform in conformity with the expansion and contraction during the operation of the multi-layer piezoelectric device can be formed, thus making it possible to suppress the internal electrode from coming off.

Fourth multi-layer piezoelectric device of the present invention is made by stacking piezoelectric layers and internal electrodes alternately one on another, wherein the piezoelectric layer contains $PbTiO_3$—$PbTZrO_3$ as the main component and contains Si in a concentration of 5 ppm or higher and less than 100 ppm.

With the piezoelectric layer that contains $PbTiO_3$—$PbTZrO_3$ as the main component and contains Si in a concentration of 5 ppm or higher and less than 100 ppm, glass phase is not formed in the grain boundary and chronic change in the volumetric specific resistance can be kept small. In the multi-layer piezoelectric device where the piezoelectric layers described above are used, the external electrodes and the internal electrodes do not break even when the piezoelectric actuator is subjected to continuous operation over a long period of time under a high voltage and a high pressure. Thus the multi-layer piezoelectric device having excellent durability can be provided.

In the fourth multi-layer piezoelectric device of the present invention, it is preferable that Si is segregated in the crystal grain boundary, and thickness of the grain boundary is not larger than 1 nm.

In the first through fourth multi-layer piezoelectric devices of the present invention, when the metal compound in the internal electrode contains group VIII metal and/or group Ib metal as the main components, the internal electrode can be formed from the metal compound that has high heat resistance and therefore can be fired together with the piezoelectric layer that has a higher firing temperature at the same time.

In the first through fourth multi-layer piezoelectric devices of the present invention, proportion M1 (% by weight) of the group VIII metal and proportion M2 (% by weight) of the group Ib metal in the internal electrode satisfy the relations $0<M1\leq15$, $85\leq M2<100$ and $M1+M2=100$, so that specific resistance of the internal electrode can be kept low. As a result, generation of heat from the internal electrode can be suppressed even when the multi-layer piezoelectric device is operated continuously over a long period of time. Moreover, since the temperature of the multi-layer piezoelectric device can be suppressed from increasing, the amount of displacement of the device can be stabilized.

In the first through fourth multi-layer piezoelectric devices of the present invention, the group VIII metal is at least one kind selected from among Ni, Pt, Pd, Rh, Ir, Ru and Os, and the group Ib metal is at least one kind selected from among Cu, Ag and Au, and any of alloy and mixed powder materials may be used to form the internal electrode.

Further, when the group VIII metal is at least one kind selected from among Pt and Pd, and the group Ib metal is at least one kind selected from among Ag and Au, the internal electrode having high heat resistance and high oxidation resistance can be formed.

Further, the group Ib metal may be Cu and the group VIII metal may be Ni. When the group VIII metal is Ni and the group Ib metal is Cu, stress generated by the displacement during operation can be mitigated and the internal electrode that is excellent in heat resistance and in heat conductivity can be formed.

Moreover, in the multi-layer piezoelectric device of the present invention, it is preferable that the internal electrode includes voids and the voids occupy 5 to 70% of cross sectional area of the internal electrode. This decreases the restriction exercised by the internal electrode on the deformation of the piezoelectric layer under the effect of electric field, thereby increasing the amount of displacement. It also provides such an advantage that stress generated in the internal electrode is mitigated by the voids, thereby improving the durability of the device. In addition, while heat transfer within the device is predominantly carried by the internal electrode, existence of the voids in the internal electrode mitigates the change in temperature within the device caused by rapid changes in the temperature outside of the device, thus making the device more resistant to thermal shock.

Effect Of The Invention

With the multi-layer piezoelectric device of the present invention having the constitution described above, the multi-layer piezoelectric device having excellent durability that can be operated continuously over a long period of time under a high voltage and a high pressure can be provided.

[Description of Reference Numerals]

Figure 1A:
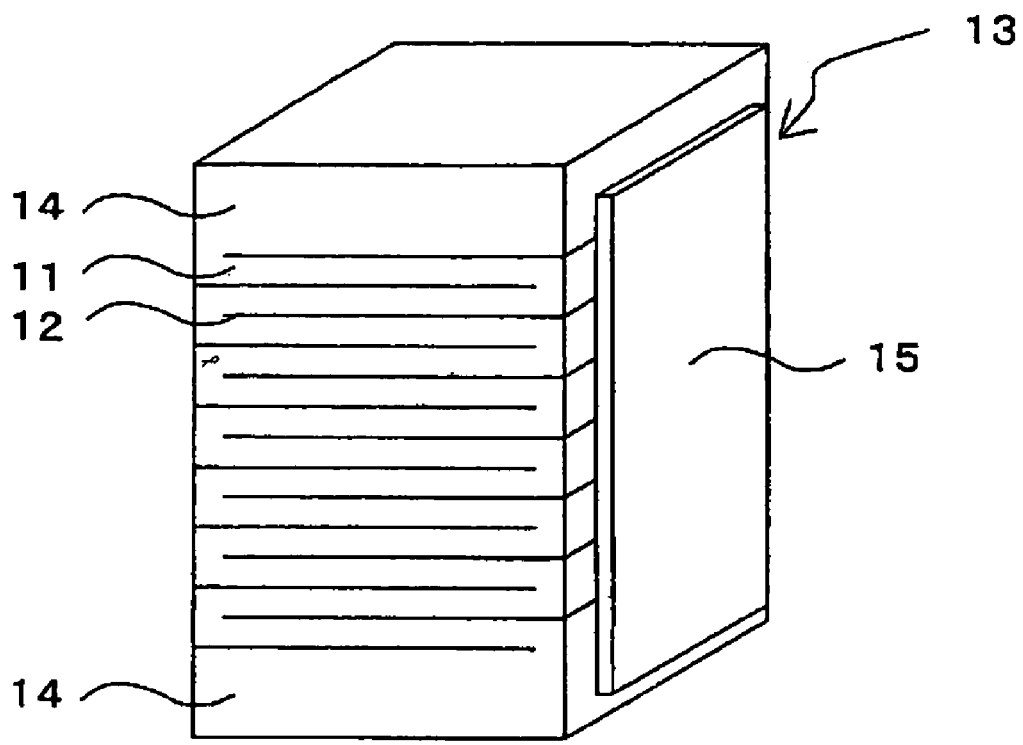
FIG. 1A is a perspective view showing the constitution of a multi-layer piezoelectric device of the present invention.

| 1, 11: | Piezoelectric material |
| 1a, 13: | Stack |
| 2, 12: | Internal electrode |

-continued

[Description of Reference Numerals]

| 3: | Insulating material |
| 5: | Lead wire |
| 4, 15: | External electrode |
| 6, 14: | Inactive region |
| 7: | Electrical conductivity assisting member |
| 31: | Container |
| 33: | Injection hole |
| 35: | Valve |
| 43: | Piezoelectric actuator |

BEST MODE FOR CARRYING OUT THE INVENTION

The multi-layer piezoelectric device according to the embodiments of the present invention will be described in detail below.

Figure 1B:
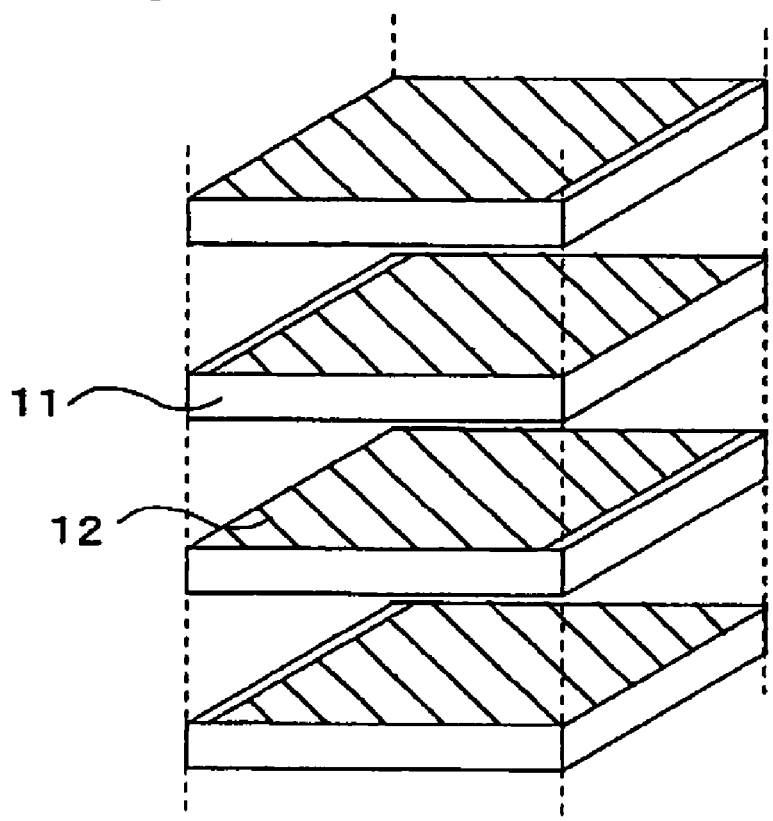
FIG. 1B is an exploded perspective view showing a part of FIG. 1A.
Figure 2:
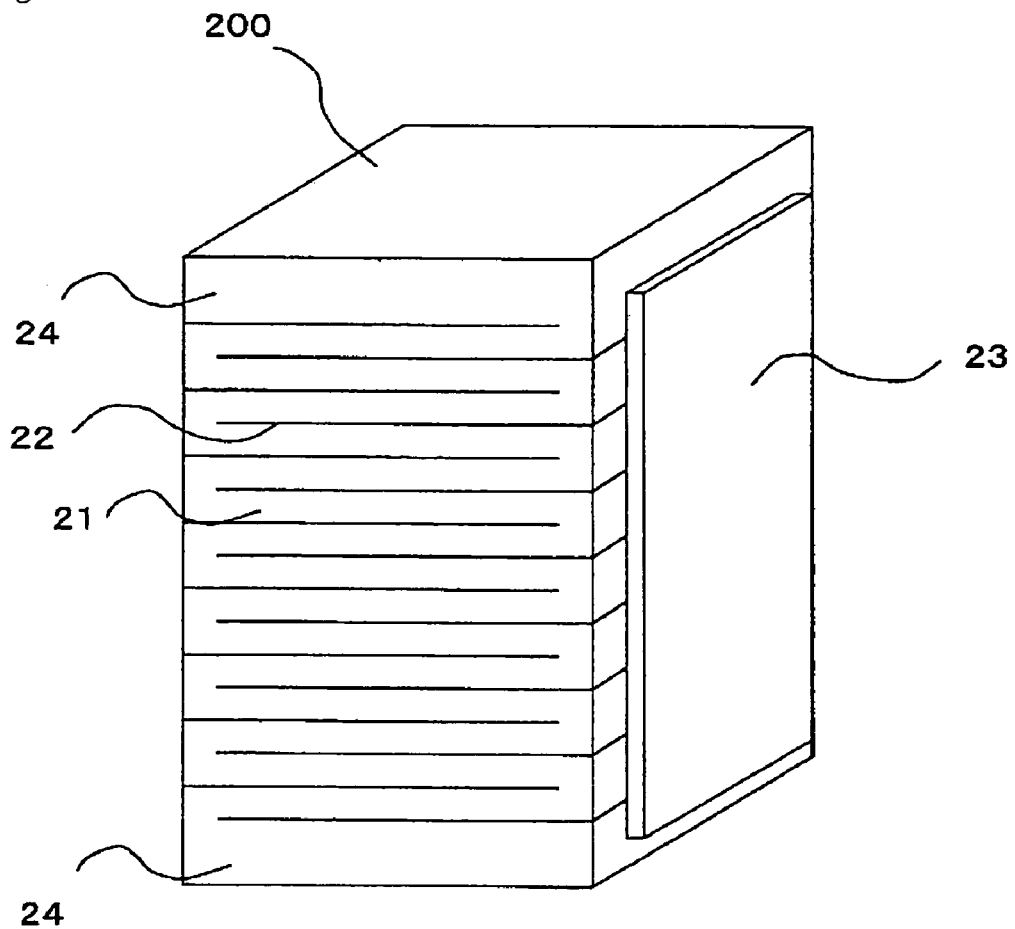
FIG. 2 is a perspective view of the multi-layer piezoelectric device of the prior art.

FIG. 1A is a perspective view showing the constitution of the multi-layer piezoelectric device according to the embodiments of the present invention. FIG. 1B is an exploded perspective view showing a part of FIG. 1A, depicting the constitution of stacking piezoelectric layers 11 and internal electrode layers 12.

In the multi-layer piezoelectric device according to the embodiments of the present invention, end of the internal electrode 12 is connected to the external electrode 15 in every other layer on a pair of side faces of a stack 13 that is constituted by stacking the piezoelectric layers 11 and the internal electrode layers 12 alternately one on another as shown in FIGS. 1A and 1B.

The stack is formed in such a constitution as (1) one of the two adjacent internal electrodes has one end thereof that is exposed on one side face where the external electrode is formed, with the other internal electrode is located inside so that the end thereof is not exposed on one side face, and (2) one of the two adjacent internal electrodes is located inside so that the end thereof is not exposed on the other side face where the external electrode is formed, with the other internal electrode having the end thereof being exposed on the other end face, while the external electrodes 15 are formed on one side face and on the other side face of the stack. With this constitution, the end of the internal electrode 12 is connected to the external electrode 15 in every other layer on the side faces where the external electrodes are formed.

On both ends of the stack 13 in the direction of stacking, inactive layers are formed whereon only the piezoelectric layers 11 are formed without the internal electrode layers. When the multi-layer piezoelectric device of this embodiment is used as the multi-layer piezoelectric actuator, lead wires may be connected to the external electrodes 15 by soldering, with the lead wires being connected to a power source installed outside.

In the multi-layer piezoelectric device according to the embodiment having the constitution described above, a predetermined voltage is applied to the piezoelectric layers 11 via the internal electrode 12, so that the piezoelectric layers 11 undergo a displacement by the reverse piezoelectric effect.

The inactive layers 14, in contrast, does not undergo a displacement even when a voltage is applied, since they are a plurality of layers of the piezoelectric layer 11 where the internal electrodes 12 are not provided.

Now embodiments of the present invention will be described in detail below.

FIRST EMBODIMENT

In the multi-layer piezoelectric device according to the first embodiment of the present invention, concentration of alkali metal in the piezoelectric layer 11 is in a range from 5 ppm to 500 ppm. When the concentration of alkali metal is lower than 5 ppm, the effect of assisting the sintering reaction is significantly low and the piezoelectric layer cannot be sintered unless the firing temperature is raised. Therefore, such low concentration of alkali metal is undesirable since the metal constituting the internal electrode is melted when forming the stack 13 at a high temperature. When the concentration is higher than 500 ppm, specific resistance of the device changes when the multi-layer piezoelectric device operated continuously, thus leading to a change in the amount of displacement and malfunction of the device.

In order to minimize the change in the amount of displacement during continuous operation, concentration of alkali metal in the piezoelectric layer 11 is preferably set in a range from 5 ppm to 100 ppm.

In order to further decrease the change in the amount of displacement, concentration of alkali metal in the piezoelectric layer 11 is more preferably set in a range from 5 ppm to 50 ppm.

Now a method for controlling the concentration of alkali metal in the piezoelectric layer within the above range will be described below.

In order to control the concentration of alkali metal in the piezoelectric layer 11, alkali metal may be added in the form of compound such as oxide, carbonate or nitrate as an inevitable impurity to the stock material of the piezoelectric layer 11 and the binder material, but the method is not limited to this. In case alkali metal content in the multi-layer piezoelectric device is controlled to cope with the alkali metal that mixes in from the crushing balls used in crushing and mixing of the stock material of the piezoelectric layer 11 and the impurity that diffuses into the material from the firing atmosphere, such a manufacturing method may also be employed as the manufacturing process is separated from that of other product so as to prevent alkali metals from mixing in from the other manufacturing process, and controlled quantities of alkali metal oxide, alkali metal carbonate or alkali metal nitrate are added as inevitable impurities to the stock material.

SECOND EMBODIMENT

The multi-layer piezoelectric device according to the second embodiment of the present invention contains alkali metal in the internal electrodes 12 in a concentration from 5 ppm to 500 ppm. When the concentration of alkali metal is lower than 5 ppm, the effect of assisting the sintering reaction is significantly low and the internal electrodes 12 cannot be sintered unless the firing temperature is raised. Therefore, such low concentration of alkali metal is undesirable. When the concentration is higher than 500 ppm, alkali metal ions diffuse from the internal electrodes 12 serving as the positive electrode into the piezoelectric layer 11 when a high DC voltage is applied to the multi-layer piezoelectric device, thereby decreasing the resistance of the piezoelectric layer 11. As a result, specific resistance of the device changes when the multi-layer piezoelectric device is operated continuously, thus leading to a change in the amount of displacement and malfunction of the device.

In order to minimize the change in the amount of displacement during continuous operation, concentration of alkali metal in the internal electrodes is preferably set in a range from 5 ppm to 100 ppm.

In order to further decrease the change in the amount of displacement, concentration of alkali metal in the internal electrodes is more preferably set in a range from 5 ppm to 50 ppm.

Now a method for controlling the concentration of alkali metal in the internal electrodes within the above range will be described below.

In order to control the concentration of alkali metal in the internal electrodes 12, alkali metal may be added in the form of compound such as oxide, carbonate or nitrate as an inevitable impurity to the stock material of the internal electrodes 12 and the binder material, but the method is not limited to this. In case alkali metal content in the multi-layer piezoelectric device is controlled to cope with the alkali metal that mixes in from the crushing balls used in crushing and mixing of the stock material of the internal electrodes 12 and the impurity that diffuses into the material from the firing atmosphere, such a manufacturing method may also be employed as the manufacturing process is separated from that of other product so as to prevent alkali metals from mixing in from the other manufacturing process, and controlled quantities of alkali metal oxide, alkali metal carbonate or alkali metal nitrate are added as inevitable impurities to the stock material.

THIRD EMBODIMENT

The multi-layer piezoelectric device according to the third embodiment of the present invention contains alkali metal in the external electrodes 15 in a concentration from 5 ppm to 500 ppm. When the concentration of alkali metal is lower than 5 ppm, the effect of assisting the sintering reaction is significantly low and the external electrodes 15 cannot be sintered unless the firing temperature is raised. Therefore, such low concentration of alkali metal is undesirable since the metal constituting the internal electrode 12 is melted when fired to such a high temperature. Furthermore, adhesion to the piezoelectric layer 11 decreases, and it is not preferred. When the concentration is higher than 500 ppm, alkali metal ions diffuse from the external electrodes 15 serving as the positive electrode into the piezoelectric layer 11 when a high DC voltage is applied to the multi-layer piezoelectric device, thereby decreasing the resistance of the piezoelectric layer 11. As a result, specific resistance of the device changes when the multi-layer piezoelectric device operated continuously, thus leading to a change in the amount of displacement and malfunction of the device.

In order to minimize the change in the amount of displacement during continuous operation, concentration of alkali metal in the external electrodes is preferably set in a range from 5 ppm to 100 ppm.

In order to further decrease the change in the amount of displacement, concentration of alkali metal in the external electrodes is more preferably set in a range from 5 ppm to 50 ppm.

Now a method for controlling the concentration of alkali metal in the external electrodes within the above range will be described below.

In order to control the concentration of alkali metal in the external electrodes 15, alkali metal may be added in the form of compound such as oxide, carbonate or nitrate as an inevitable impurity to the stock material of the external electrodes 15 and the binder material, but the method is not limited to this. In case alkali metal content in the multi-layer piezoelectric device is controlled to cope with the alkali metal that mixes in from the crushing balls used in crushing and mixing of the stock material of the external electrodes 15 and the impurity that diffuses into the material from the firing atmosphere, such a manufacturing method may also be employed as the manufacturing process is separated from that of other product so as to prevent alkali metals from mixing in from the other manufacturing process, and controlled quantities of alkali metal oxide, alkali metal carbonate or alkali metal nitrate are added as inevitable impurities to the stock material.

FOURTH EMBODIMENT

The multi-layer piezoelectric device according to the fourth embodiment of the present invention contains alkali metal in the multi-layer piezoelectric device in a concentration from 5 ppm to 300 ppm. When the concentration of alkali metal is lower than 5 ppm, the effect of assisting the sintering reaction is significantly low and the stack 13 cannot be sintered unless the firing temperature is raised. Therefore, such low concentration of alkali metal is undesirable. When the concentration is higher than 300 ppm, specific resistance of the device changes when the multi-layer piezoelectric device is operated continuously, thereby causing the amount of displacement to change and causing malfunction of the device to occur. In order to minimize the change in the amount of displacement of the multi-layer piezoelectric device during continuous operation, concentration of alkali metal in the multi-layer piezoelectric device is preferably set in a range from 5 ppm to 100 ppm, and more preferably in a range from 5 ppm to 50 ppm.

Now a method for controlling the concentration of alkali metal in the multi-layer piezoelectric device within the above range will be described below.

In order to control the concentration of alkali metal in the multi-layer piezoelectric device, alkali metal may be added in the form of compound such as oxide, carbonate or nitrate as an inevitable impurity to the stock materials of the piezoelectric layers 11, the internal electrode layers 12, the external electrodes 15 and the binder material, but the method is not limited to this. In case alkali metal content in the multi-layer piezoelectric device is controlled to cope with the alkali metal that mixes in from the crushing balls used in crushing and mixing of the stock material of the piezoelectric layer 11 and the impurity that diffuses into the material from the firing atmosphere, such a manufacturing method may also be employed as the manufacturing process is separated from that of other product so as to prevent alkali metals from mixing in from the other manufacturing process, and controlled quantities of alkali metal oxide, alkali metal carbonate or alkali metal nitrate that become the inevitable impurities are added to the stock material.

In the first through fourth embodiments, alkali metal contents in the piezoelectric layers 11, in the internal electrode layers 12 and in the external electrodes can be measured by applying ICP emission spectrochemical analysis to a cut surface of the multi-layer piezoelectric device that has been processed so as to selectively leave the desired portions to remain through etching or the like thereby separating the piezoelectric layers, the internal electrode layers and the external electrodes. Alkali metal contents in the multi-layer piezoelectric device can be measured by applying ICP emission spectrochemical analysis to a sample of the multi-layer piezoelectric device. The method is not limited to the ICP emission spectrochemical analysis, and Auger electron spectroscopy, EPMA (Electron Probe Micro Analysis) or the like may be used as long as the minimum detectable limit is at similar level.

According to the present invention, the alkali metal is preferably at least one kind of Na and K. While alkali metals include lithium, sodium, potassium, rubidium, cesium and francium, Na and K have higher tendency to ionize and migrate and therefore are advantageously used in decreasing the device resistance of the multi-layer piezoelectric device thereby decreasing the amount of displacement of the multi-layer piezoelectric device.

FIFTH EMBODIMENT

The multi-layer piezoelectric device according to the fifth embodiment of the present invention contains halogen element in the piezoelectric layer in a concentration from 5 ppm to 1500 ppm. When the concentration of halogen element is lower than 5 ppm, the effect of assisting the sintering reaction is significantly low and the piezoelectric layers cannot be sintered unless the firing temperature is raised. Therefore, such low concentration of halogen element is undesirable since the metal constituting the internal electrode is melted when the stack 13 is formed. When the concentration is higher than 1500 ppm, specific resistance of the device changes when the multi-layer piezoelectric device operated continuously, thus leading to a change in the amount of displacement which leads to malfunction of the device or short-circuiting that interrupts the operation.

In order to minimize the change in the amount of displacement of the device during continuous operation, concentration of halogen element in the piezoelectric layers is preferably set in a range from 5 ppm to 100 ppm.

In order to further decrease the change in the amount of displacement of the device, concentration of halogen element in the piezoelectric layers is more preferably set in a range from 5 ppm to 50 ppm.

Now a method for controlling the concentration of halogen element in the piezoelectric layers within the above range will be described below.

In order to control the concentration of halogen element in the piezoelectric layers 11, halogen element may be added in the form of compound such as fluoride, chloride, bromide, iodide or astatine compound as an inevitable impurity to the stock material of the piezoelectric layers 11 and the binder material, but the method is not limited to this. In case halogen element content in the multi-layer piezoelectric device is controlled so as to cope with the halogen element that mixes in from the crushing balls used in crushing and mixing of the stock material of the piezoelectric layers 11 and the impurity that diffuses into the material from the firing atmosphere, such a manufacturing method may also be employed as the manufacturing process is separated from that of other product so as to prevent halogen element from mixing in from the other manufacturing process, and contents of fluoride, chloride, bromide, iodide or astatine compound that become the inevitable impurities of halogen component in the stock material are controlled, thereby controlling the halogen element content.

SIXTH EMBODIMENT

The multi-layer piezoelectric device according to the sixth embodiment of the present invention contains halogen element in the internal electrodes in a concentration from 5 ppm to 1500 ppm. When the concentration of halogen element is lower than 5 ppm, the effect of assisting the sintering reaction is significantly low and the internal electrodes cannot be sintered unless the firing temperature is raised. Therefore, such low concentration of halogen element is undesirable. When the concentration is higher than 1500 ppm, halogen ions diffuse from the internal electrodes 12 serving as the negative electrode into the piezoelectric layer 11 when a high DC voltage is applied to the multi-layer piezoelectric device, thereby decreasing the resistance of the piezoelectric layer 11. As a result, specific resistance of the device changes, thus leading to a change in the amount of displacement and malfunction of the device.

In order to minimize the change in the amount of displacement during continuous operation, concentration of halogen element in the internal electrodes is preferably set in a range from 5 ppm to 100 ppm.

In order to further decrease the change in the amount of displacement, concentration of halogen element in the internal electrodes is more preferably set in a range from 5 ppm to 50 ppm.

Now a method for controlling the concentration of halogen element in the internal electrodes within the above range will be described below.

In order to control the concentration of halogen element in the internal electrodes 12, halogen element may be added in the form of compound such as fluoride, chloride, bromide, iodide or astatine compound as inevitable impurity to the stock material of the internal electrodes 12 and the binder material, but the method is not limited to this. In case halogen element content in the multi-layer piezoelectric device is controlled so as to cope with the halogen element that mixes in from the crushing balls used in crushing and mixing of the stock material of the piezoelectric layers 11 and the impurity that diffuses into the material from the firing atmosphere, such a manufacturing method may also be employed as the manufacturing process is separated from that of other product so as to prevent halogen element from mixing in from the other manufacturing process, and the contents of fluoride, chloride, bromide, iodide or astatine compound that become the inevitable impurities of the stock material are controlled, thereby controlling the halogen element content.

SEVENTH EMBODIMENT

The multi-layer piezoelectric device according to the seventh embodiment of the present invention contains alkali metal in the external electrodes in a concentration from 5 ppm to 500 ppm. When the concentration of alkali metal is lower than 5 ppm, the effect of assisting the sintering reaction is significantly low and the external electrodes cannot be sintered unless the firing temperature is raised. Therefore, such low concentration of alkali metal is undesirable since the metal of the internal electrode is melted at such a high temperature when fired. When the concentration is higher than 500 ppm, halogen ions diffuse from the external electrodes 15 serving as the negative electrode into the piezoelectric layer 11 when a high DC voltage is applied to the multi-layer piezoelectric device, thereby decreasing the resistance of the piezoelectric layer 11. As a result, specific resistance of the device changes, thus leading to a change in the amount of displacement and malfunction of the device.

In order to minimize the change in the amount of displacement of the device during continuous operation, concentration of halogen element in the external electrodes is preferably set in a range from 5 ppm to 100 ppm.

In order to further decrease the change in the amount of displacement of the device, concentration of halogen element in the external electrodes is more preferably set in a range from 5 ppm to 50 ppm.

Now a method for controlling the concentration of halogen element in the external electrodes within the above range will be described below.

In order to control the concentration of halogen element in the external electrodes 15, halogen element may be added in the form of compound such as fluoride, chloride, bromide, iodide or astatine compound as inevitable impurity to the stock material of the external electrodes 15 and the binder material, but the method is not limited to this. In case halogen element content in the multi-layer piezoelectric device is controlled so as to cope with the halogen element that mixes in from the crushing balls used in crushing and mixing of the stock material of the piezoelectric layers 11 and the impurity that diffuses into the material from the firing atmosphere, such a manufacturing method may also be employed as the manufacturing process is separated from that of other product so as to prevent halogen element from mixing in from the other manufacturing process, and the contents of fluoride, chloride, bromide, iodide or astatine compound that become the inevitable impurities of the stock material are controlled, thereby controlling the halogen element content.

EIGHTH EMBODIMENT

The multi-layer piezoelectric device according to the eighth embodiment of the present invention contains halogen element in the multi-layer piezoelectric device in a concentration from 5 ppm to 300 ppm. When the concentration of halogen element is lower than 5 ppm, the effect of assisting the sintering reaction is significantly low and the stack 13 cannot be sintered unless the firing temperature is raised. Therefore, such low concentration of halogen element is undesirable. When the concentration is higher than 300 ppm, specific resistance of the device changes when the multi-layer piezoelectric device is operated continuously, thereby causing the amount of displacement to change and malfunction of the device to occur. In order to minimize the change in the amount of displacement of the multi-layer piezoelectric device during continuous operation, concentration of halogen element in the multi-layer piezoelectric device is preferably set in a range from 5 ppm to 100 ppm, and more preferably set in a range from 5 ppm to 50 ppm.

Now a method for controlling the concentration of halogen element in the multi-layer piezoelectric device within the above range will be described below. In order to control the concentration of halogen element in the multi-layer piezoelectric device, halogen element may be added in the form of compound such as fluoride, chloride, bromide, iodide or astatine compound as inevitable impurity to the stock materials of the piezoelectric layers 11, the internal electrode layers 12, the external electrodes 15 and the binder material, but the method is not limited to this. In case halogen element content in the multi-layer piezoelectric device is controlled to cope with the halogen element that mixes in from the crushing balls used in crushing and mixing of the stock material of the piezoelectric layers 11 and the impurity that diffuses into the material from the firing atmosphere, such a manufacturing method may also be employed as the manufacturing process is separated from that of other product so as to prevent halogen element from mixing in from the other manufacturing process, and the contents of fluoride, chloride, bromide, iodide or astatine compound that become the inevitable impurities of the stock material are controlled, thereby controlling the halogen element content.

In the fifth through eighth embodiments, halogen element contents in the piezoelectric layers, in the internal electrode layers and in the external electrodes can be measured by ion chromatography with a cut surface of the multi-layer piezoelectric device that has been processed so as to selectively leave the desired portions to remain through etching or the like thereby separating the piezoelectric layers, the internal electrode layers and the external electrodes. Halogen element content in the multi-layer piezoelectric device can be measured by applying the ion chromatography method to a sample of the multi-layer piezoelectric device. The method is not limited to the ion chromatography, and Auger electron spectroscopy, EPMA (Electron Probe Micro Analysis) or the like may be used as long as the minimum detectable limit is at similar level.

More preferably, the multi-layer piezoelectric device may include alkali metal in a concentration from 5 ppm to 300 ppm and halogen element in a concentration from 5 ppm to 1000 ppm. This makes it possible to prevent the metal elements that constitute the electrodes from diffusing in such a process as silver migration, in addition to the effects described above.

According to the present invention, the halogen element is preferably at least one kind of Cl and Br. While halogen elements include fluorine, chlorine, bromine, iodine and astatine, Cl and Br have higher tendency to ionize and migrate and therefore are advantageously used in decreasing the device resistance of the multi-layer piezoelectric device thereby decreasing the amount of displacement of the multi-layer piezoelectric device.

By controlling the concentrations of alkali metal and halogen element in the multi-layer piezoelectric device of the present invention within the ranges described above, it is made possible to keep the heat generated during the continuous operation constant and control the amount of displacement constant.

In order to suppress the heat generated by the multi-layer piezoelectric device during operation, it is necessary to decrease the induction loss (tan δ) of the piezoelectric layer 11 and/or device resistance, in addition to controlling the impurity concentrations within the ranges described above.

NINTH EMBODIMENT

In the multi-layer piezoelectric device according to the ninth embodiment of the present invention, the ratio of change in the dimension of the multi-layer piezoelectric device after continuous operation to the initial device dimension is set within 1%. This is because the ratio of change in the dimension of the multi-layer piezoelectric device after continuous operation higher than 1% leads to a great change in the dimension of the multi-layer piezoelectric device which may cause destruction of the multi-layer piezoelectric device due to thermal excursion.

The ratio of change in device dimension after continuous operation to the initial dimension refers to the ratio of change in the dimension of the multi-layer piezoelectric device in the stacking direction, after about $1 \times 10^9$ cycles of continuous operation under an AC voltage applied to the multi-layer piezoelectric device, to the initial device dimension of the multi-layer piezoelectric device before the continuous operation.

In the multi-layer piezoelectric device of the present invention, the ratio of change in thickness of the internal electrode 12 after continuous operation of the multi-layer piezoelectric device to the initial thickness is set within 5%. This is because, when the ratio of change in thickness of the internal electrode 12 after continuous operation of the multi-layer piezoelectric device to the initial thickness is higher than 5%, significant deterioration of the multi-layer piezoelectric device that is represented by the change in the amount of displacement of the multi-layer piezoelectric device occurs, thus resulting in a significant deterioration of durability of the multi-layer piezoelectric device.

The ratio of change in thickness of the internal electrode after continuous operation to the initial thickness refers to the ratio of change in the thickness of the internal electrode in the stacking direction of the multi-layer piezoelectric device, after about $1 \times 10^9$ cycles of continuous operation under an AC voltage applied to the multi-layer piezoelectric device, to the initial thickness of the internal electrode before the continuous operation. In case five or more internal electrodes 12 are provided in the multi-layer piezoelectric device, thickness is measured by means of SEM for the internal electrodes 12 making contact with the inactive layers 14 (at two positions), the internal electrode 12 located at intermediate position in the stacking direction of the multi-layer piezoelectric device (at one position) and any of the internal electrodes 12 located at intermediate position between the intermediately positioned internal electrodes 12 and the inactive layer 14 (at one position), and the mean value of these measurements is taken as the thickness of the internal electrode. In case less than five internal electrodes 12 are provided in the multi-layer piezoelectric device, thickness is measured on every internal electrode 12, and the mean value of these measurements is taken as the thickness of the internal electrode.

In the multi-layer piezoelectric device according to the ninth embodiment of the present invention, it is necessary to prevent volumetric expansion of the internal electrodes 12 from occurring due to oxidation, in order to suppress the device dimension and thickness of the internal electrodes 12 from changing after continuous operation. Volumetric expansion of the internal electrodes 12 can be suppressed as follows.

In the prior art, such means have been employed as to keep the device temperature constant during continuous operation or finely adjust the applied voltage in accordance to the device temperature, in order to suppress the device dimension and thickness of the internal electrodes from changing after continuous operation. Specifically, the operating voltage has controlled while monitoring the device temperature, or a heat sink has been installed in order to dissipate heat and control the temperature around the device.

In the ninth embodiment, in contrast, the device temperature is controlled during continuous operation by suppressing the heat generation from the device at the source during operation. In order to control the device temperature during operation, it is necessary to decrease the induction loss (tan δ) of the piezoelectric layer 11 and/or decrease device resistance In case the piezoelectric layer 11 is constituted from perovskite type oxide such as $PbZrO_3$—$PbTiO_3$ as the main component, induction loss (tan δ) of the piezoelectric layer 11 may be reduced by firing the stack 13 in an atmosphere of excessive oxygen, or cooling down at a slow rate from the peak temperature of firing the stack 13. Specifically, cooling rate may be set to 600° C. per hour or less, or preferably 300° C. per hour or less. Value of induction loss (tan δ) may be less than 1.5%, or preferably 0.5% or less.

In order to decrease the device resistance, a dense structure may be formed with a path for electrical conductivity secured therein, in addition to using a material of a composition having lower specific resistance for the internal electrode 12.

Moreover, since it is desirable that the amount of displacement of the material constituting the piezoelectric layer 11 is constant regardless of the operating temperature, a piezoelectric material that undergoes smaller change in the amount of displacement as the temperature varies during continuous operation.

In order to dissipate heat efficiently from the device to the outside, it is preferable to form the internal electrode 12 through which heat is transmitted from a material having composition of excellent heat conductivity.

Moreover, it is desirable that the metal compound that constitutes the internal electrode 12 contains group VIII metal and/or group Ib metal as the main component. Since the metals of these groups have high heat resistance, the internal electrode 12 can be fired together with the piezoelectric layer 11 that has high firing temperature at the same time.

It is also preferable that the metal compound that constitutes the internal electrode 12 has proportion M1 (% by weight) of the group VIII metal and proportion M2 (% by weight) of the group Ib metal that satisfy the relations $0<M1\leq 15$, $85\leq M2<100$ and $M1+M2=100$. This is because proportion of group VIII metal higher than 15% by weight leads to high specific resistance of the internal electrode 12 which causes the internal electrode 12 to generate heat when the multi-layer piezoelectric device is operated continuously. In order to suppress the group Ib metal contained in the internal electrode 12 from migrating into the piezoelectric layer 11, proportion of group VIII metal is preferably in a range from 0.001% by weight to 15% by weight. In order to improve the durability of the multi-layer piezoelectric device, the proportion is preferably in a range from 0.1% by weight to 10% by weight. When higher heat conductivity and higher durability are required, the proportion is preferably in a range from 0.5% by weight to 9.5% by weight. In order to improve durability further, the proportion is preferably in a range from 2% by weight to 8% by weight.

When the proportion of Ib metal is less than 85% by weight, the internal electrode 12 has high specific resistance that causes the internal electrode 12 to generate heat when the multi-layer piezoelectric device is operated continuously. In order to suppress the group Ib metal contained in the internal electrode 12 from migrating into the piezoelectric layer 11, proportion of group Ib metal is preferably in a range from 85% by weight to 99.999% by weight. In order to improve the durability of the multi-layer piezoelectric device, the proportion is preferably in a range from 90% by weight to 99.9% by weight. When higher durability is required, the proportion is preferably in a range from 90.5% by weight to 99.5% by weight. In order to improve durability further higher, the proportion is preferably in a range from 92% by weight to 98% by weight.

The group VIII metal and the group Ib metal in the internal electrode 12 can be identified by analytical method such as EPMA (Electron Probe Micro Analysis).

Metal elements contained in the internal electrode 12 of the present invention are preferably the group VIII metal that is at least one kind selected from among Ni, Pt, Pd, Rh, Ir, Ru and Os, and the group Ib metal that is at least one kind selected from among Cu, Ag and Au, since such a metal composition is advantageous in volume production when the alloy powder synthesizing technology available today is employed.

Further, it is preferable that the group VIII metal contained in the internal electrode 12 is at least one kind selected from among Pt and Pd, and the group Ib metal is at least one kind selected from among Ag and Au. This compositions makes it possible to form the internal electrode 12 having high heat resistance and low specific resistance.

Further, it is preferable that the group VIII metal contained in the internal electrode 12 is Ni and the group Ib metal is Cu. This compositions makes it possible to form the internal electrode 12 having higher durability and excellent heat conductivity.

Further it is preferable to add an inorganic component along with the metallic component in the internal electrode 12. This increases the bonding strength between the internal electrode 12 and the piezoelectric layer 11. It is preferable that the inorganic component contains perovskite type oxide consisting of $PbZrO_3$—$PbTiO_3$ as the main component.

It is further preferable that the piezoelectric layer 11 contains perovskite type oxide as the main component. This is because the piezoelectric layer 11 formed from perovskite type oxide such as barium titanate ($BaTiO_3$) has high piezoelectric strain constant $d_{33}$ which enables it to increase the amount of displacement. This constitution also enables the piezoelectric layer 11 and the internal electrode 12 to be fired at the same time. It is also preferable that the piezoelectric layer 11 contains perovskite type oxide consisting of $PbZrO_3$—$PbTiO_3$ that has a relatively high value of piezoelectric strain constant $d_{33}$ as the main component.

The firing temperature is preferably in a range from 900 to 1000° C. When the firing temperature is lower than 900° C., the firing process does not fully proceed, and it becomes difficult to make dense piezoelectric layer 11. When the firing temperature is higher than 1000° C., larger stress is generated due to the difference in contraction between the internal electrode 12 and the piezoelectric layer 11 when fired, thus resulting in cracks occurring during continuous operation of the multi-layer piezoelectric device.

The deviation in the composition of the internal electrode 12 that is caused by the firing operation is preferably not larger than 5%. This is because a deviation larger than 5% in the composition of the internal electrode 12 caused by the firing operation causes a greater amount of the metallic component contained in the internal electrode 12 to diffuse into the piezoelectric layer 11, thus making it impossible for the internal electrode 12 to deform in conformity with the expansion and contraction of the multi-layer piezoelectric device during operation.

The deviation in the composition of the internal electrode 12 refers to the variation in the composition of the internal electrode 12 caused by evaporation of the elements that constitute the internal electrode 12 due to firing or diffusion thereof into the piezoelectric layer 11.

In the multi-layer piezoelectric device of the present invention, the internal electrode 12 of which end is exposed on the side face of the multi-layer piezoelectric device and the internal electrode 12 of which end is not exposed are stacked alternately, while a groove is formed in the piezoelectric layer located between the internal electrode 12 of which end is not exposed and the external electrode 15. The groove is preferably filled with an insulating material having Young's modulus lower than that of the piezoelectric layer 11. In the multi-layer piezoelectric device having the groove filled with an insulating material having low Young's modulus, stress caused by the displacement during operation can be mitigated, thus enabling it to suppress heat generation from the internal electrode 12 even when operated continuously.

The multi-layer piezoelectric devices of the first through ninth embodiments are manufactured as described below.

First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DOP (dioctyl phthalate) or DBP (dibutyl phthalate) are mixed to form a slurry which is formed into a ceramic green sheet that would become the piezoelectric layer 11 by a known method such as doctor blade process or calender roll process or other tape molding method.

Then a metal powder such as silver-palladium that constitutes the internal electrode, a binder and a plasticizer are mixed to prepare an electrically conductive paste which is applied onto the top surface of the ceramic green sheet by screen printing or the like to a thickness of 1 to 40 μm.

A plurality of the green sheets having the electrically conductive paste printed thereon are stacked one on another, with the stack being heated at a predetermined temperature to remove the binder. The stack is then fired at a temperature in a range from 900 to 1200° C. thereby to make the stack 13. Firing temperature is preferably in a range from 900 to 1000° C.

The method of making the stack 13 is not limited to that described above, and any manufacturing method may be employed as long as the stack 13 can be made in such a constitution as a plurality of the piezoelectric layers 11 external electrode forming surface of the column-like stack 13, and is bonded by baking at a temperature that is higher than the softening point of the glass and is not higher than the melting point (965° C.) of silver and is not higher than 4/5 of the firing temperature (0° C.). In this process, the binder contained in the sheet that is formed from the electrically conductive silver-glass paste is evaporated and removed, so that the external electrode 15 is formed from a porous electrical conductor having three-dimensional mesh structure.

The temperature at which the electrically conductive silver-glass paste is bonded by baking is preferably in a range from 550 to 700° C. for the purpose of effectively forming a neck, joining the silver content that is contained in the electrically conductive silver-glass paste and the internal electrode 12 through diffusion bonding, effectively causing the voids in the external electrode 15 to remain and partially joining the external electrode 15 and the side face of the column-like stack 13. Softening point of the glass component contained in the electrically conductive silver-glass paste is preferably in a range from 500 to 700° C.

When the baking temperature is higher than 700° C., sintering of the silver powder of the electrically conductive silver-glass paste would proceed excessively, such that the porous electrical conductor of three-dimensional mesh structure cannot be effectively formed and the external electrodes 15 become too dense. As a result, the value of Young's modulus of the external electrode 15 becomes too high to effectively absorb the stress generated during operation, eventually leading to breakage of the external electrode 15. Baking is preferably carried out at a temperature that is not higher than 1.2 times the softening point of the glass.

When the baking temperature is lower than 550° C., on the other hand, the end of the internal electrode 12 and the external electrode 15 cannot be joined sufficiently through diffusion, and therefore the neck cannot be formed thus resulting in spark occurring between the internal electrode 12 and the external electrode 15 during operation.

Thickness of the sheet formed from the electrically conductive silver-glass paste is preferably smaller than the thickness of the piezoelectric layer 11. More preferably, the thickness is 50 μm or less in order to accommodate the contraction and expansion of the actuator.

Then the stack 13 having the external electrodes 15 formed thereon is immersed in a silicone rubber solution while deaerating the silicone rubber solution by evacuation, so as to fill the groove of the stack 13 with the silicone rubber. Then the stack 13 is pulled out of the silicone rubber solution and is coated with the silicone rubber on the side faces thereof. Then the silicon rubber that fills the groove and covers the side faces of the column-like stack 13 is hardened, thereby completing the multi-layer piezoelectric device of the present invention.

Then lead wires are connected to the external electrodes 15 and a DC voltage of 0.1 to 3 kV/mm is applied between the pair of external electrodes 15 via the lead wires so as to apply polarization treatment to the stack 13, thereby to complete the multi-layer piezoelectric actuator that employs the multi-layer piezoelectric device of the present invention. When the lead wires are connected to an external voltage source and the voltage is supplied via the lead wires and the external electrodes 15 to the internal electrodes 12, the piezoelectric layers 11 undergo a significant amount of displacement by the reverse piezoelectric effect, so as to drive, for example, an automobile fuel injection valve that supplies fuel to an engine.

An electrical conductivity assisting member formed from an electrically conductive adhesive, containing a metal mesh and a plurality of the internal electrodes 12 are stacked alternately one on another.

Then the internal electrode 12 of which end is exposed on the side face of the multi-layer piezoelectric device and the internal electrode 12 of which end is not exposed are formed alternately, while the groove is formed in the piezoelectric layer located between the internal electrode 12 of which end is not exposed and the external electrode 15, with the groove filled with an insulating material such as resin or rubber having Young's modulus lower than that of the piezoelectric layer 11. The groove is formed on the side face of the stack 13 by means of a dicing apparatus or the like.

The electrically conductive material that constitutes the external electrode 15 is preferably silver that has a low value of Young's modulus or an alloy based on silver, in consideration of the capability to sufficiently absorb the stress generated by the expansion and contraction of the actuator.

Then an electrically conductive silver-glass paste is prepared by adding a binder to a glass powder, and the mixture is formed into a sheet that is dried to remove solvent while controlling the density of the green sheet in a range from 6 to 9 g/cm$^3$. The sheet is transferred onto the or a mesh-like metal sheet embedded therein, may be provided on the external surface of the external electrode 15. By providing the electrical conductivity assisting member on the external surface of the external electrode 15, it is made possible to cause a large current to flow in the electrical conductivity assisting member even when the device is operated at a high speed by supplying a large current to the actuator so as to decrease the current flowing in the external electrodes 15, thereby preventing the external electrodes 15 from breaking due to localized heat generation and greatly improving durability. Moreover, by embedding the metal mesh or a mesh-like metal sheet in the electrically conductive adhesive, it is made possible to prevent the electrically conductive adhesive from cracking due to expansion and contraction of the stack during operation.

The metal mesh refers to a structure of entwined metal wires, and the mesh-like metal sheet refers to a metal sheet with a number of holes punched therethrough.

It is preferable that the electrically conductive adhesive that constitutes the electrical conductivity assisting member is polyimide resin containing silver powder dispersed therein. When polyimide resin that has high heat resistance and contains silver powder which has low specific resistance dispersed therein is used as the electrically conductive adhesive, such an electrical conductivity assisting member can be formed that maintains low resistance and high bonding strength even when the stack is operated at a high temperature. More preferably, the electrically conductive particles are non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

The multi-layer piezoelectric device of the present invention is not limited to the constitutions described above, and various modifications may be made without deviating from the spirit of the present invention.

While an example where the external electrodes 15 are formed on the opposing side faces of the stack 13 has been described above, a pair of external electrodes may be formed, for example, on adjacent side faces according to the present invention.

TENTH EMBODIMENT

Figure 4A:
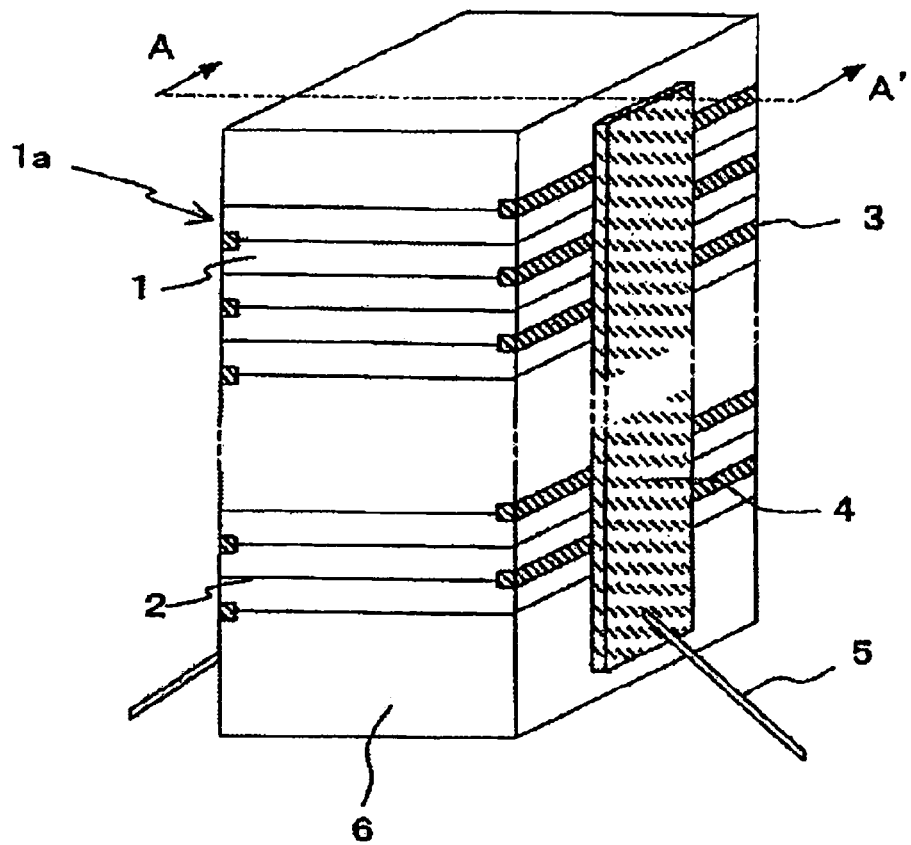
FIG. 4A is a perspective view showing the constitution of a multi-layer piezoelectric device according to tenth embodiment of the present invention.
Figure 4B:
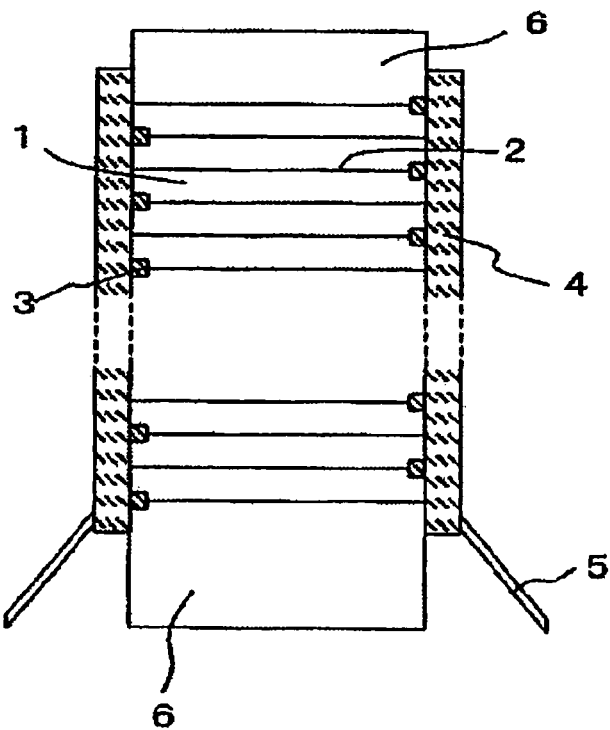
FIG. 4B is a sectional view taken along lines A-A' of FIG. 4A.

FIG. 4A is a perspective view showing the multi-layer piezoelectric device (multi-layer piezoelectric actuator) according to the tenth embodiment of the present invention. FIG. 4B is a sectional view taken along lines A-A' of FIG. 4A.

The multi-layer piezoelectric actuator according to the tenth embodiment comprises a column-like stack 1a having rectangular prism shape formed by stacking a plurality of piezoelectric layers 1 and a plurality of internal electrodes 2 alternately one on another, wherein the ends of every other internal electrodes 2 are covered by an insulating material 3 on the side face of the stack 1a, and an external electrode 4 formed from a porous electrical conductor made of an electrically conductive material containing silver as the main material and glass having three-dimensional mesh structure is joined with the end of the internal electrode 2 that is not covered by the insulating material 3, while lead wires 5 are connected to the external electrodes 4, as shown in FIG. 4. Reference numeral 6 denotes an inactive layer.

The piezoelectric layer 1 is formed from PZT-based piezoelectric ceramic material which will be described in detail later. The piezoelectric ceramic material preferably has a high value of piezoelectric strain constant $d_{33}$ that represents the piezoelectric characteristic thereof.

Thickness of the piezoelectric layer 1, namely the distance between the internal electrodes 2, is preferably in a range from 50 to 250 µm. This makes it possible to make the actuator of smaller size and low profile, and prevent insulation breakdown of the piezoelectric layer 1 from occurring, even when a larger number of layers are stacked so as to achieve a greater amount of displacement of the multi-layer piezoelectric actuator by applying a voltage.

While the internal electrodes 2 are provided between the piezoelectric layers 1, metal compound of the internal electrodes 2 is constituted from group VIII metal and group Ib metal of the periodic table. The group VIII metal is at least one kind selected from among Pt and Pd, and the group Ib metal is at least one kind selected from among Ag and Au. For example, Ag—Pd alloy may be used.

When proportion M1 (% by weight) of the group VIII metal and proportion M2 (% by weight) of the group Ib metal satisfy the relations 0<M1<15 and 85<M2<100, low-cost multi-layer piezoelectric device can be provided since the use of the expensive group Ib metal can be reduced. When the content of group Ib metal is reduced, melting point of the alloy becomes lower and only such a kind of porcelain that can be sintered at a low temperature of 1000° C. or less can be used. It becomes easier for the crystal grains of the porcelain to grow when the porcelain contains 5 ppm or higher and less than 100 ppm of Si content, allowing it to sinter at a lower temperature. Si content within this range does not adversely affect the piezoelectric characteristic.

Formed on the side face of the column-like stack 1a in every other layer are grooves measuring 30 to 500 µm in depth and 30 to 200 µm in width in the stacking direction. The grooves are filled with glass, epoxy resin, polyimide resin, polyamide-imide resin, silicone rubber or the like that has Young's modulus lower than that of the piezoelectric layer 1 so as to form an insulating material 3. The insulating material 3 is preferably a material having a low value of elastic coefficient, particularly silicone rubber or the like, that can deform in conformity with the displacement of the stack 1a, in order to make a firm joint with the column-like stack 1a.

The external electrodes 4 are connected to the two opposing side faces of the column-like stack 1a, and the external electrodes 4 are electrically connected to the internal electrodes 2 that are stacked in every other layer. The external electrodes 4 serve to supply the voltage that is required in common to cause the piezoelectric layers 1 to undergo displacement by the reverse piezoelectric effect, to the internal electrodes 2 that are connected thereto.

Connected to the external electrode 4 are lead wires 5 by soldering. The lead wires 5 serve to connect the external electrode 4 to an outside power supply.

According to the present invention, the piezoelectric ceramic material that constitutes the piezoelectric layers 1 is formed from $PbTiO_3$—$PbZrO_3$ as the main component, and contains 5 ppm or higher and less than 100 ppm of Si content. Si has an effect of improving the strength of the porcelain. When the Si content is within the range described above, segregation of Si occurs in the grain boundary so as to increase the bonding strength between crystal grains, thereby suppressing fall-off of grains during machining or ultrasonic cleaning. With regards to the mechanism of deterioration of specific resistance, it has known that deterioration of the crystal grain boundary induced by DC electric field corresponds to the deterioration of porcelain. In piezoelectric ceramic material, crystal grain boundary has higher resistivity than the inner portion of grain has. When a DC electric field is applied, strong electric field is generated in the crystal grain boundary due to Maxwell-Wagner type polarization. It is supposed that this electric field causes local insulation breakdown that results in deterioration of specific resistance of the porcelain. Based on the above discussion, Si content of 100 ppm or higher leads to the formation of glass phase in the grain boundary which increases the resistivity in the grain boundary, thus causing strong electric field in the crystal grain boundary that results in local insulation breakdown and therefore leads to deterioration of specific resistance of the porcelain. When Si content is less than 100 ppm, no clear glass phase is generated in the grain boundary and Si exists in the form of $SiO_2$ about the size of single molecule. This results in lower resistivity in the grain boundary which makes local insulation breakdown less likely to occur. When Si content is less than 5 ppm, since the effect of improving the bonding strength between the crystal grains becomes weaker, fall-off of grains is likely to occur during machining or ultrasonic cleaning.

The piezoelectric ceramic material of the present invention is a sintered material that is constituted substantially from perovskite type compound except for the component constituted from Si. The phrase "constituted substantially from perovskite type compound" means that the material is made up of perovskite type compound except for impurities, with no other components intentionally added. The impurities (Si excluded) may be contained in a concentration less than 100 ppm.

According to the present invention, it is preferable that Si is segregated in the crystal grain boundary and thickness of the crystal grain boundary is 1 nm or less. When Si content is less than 100 ppm, Si is segregated in the crystal grain boundary and thickness of the crystal grain boundary is 1 nm or less. This makes it possible to decrease the chronic change in the specific resistance while increasing the strength of the porcelain while having no influence on the characteristics such as piezoelectric strain constant. This is because, while solid solution of Si in the crystal grains significantly decreases the piezoelectric characteristics, segregation in the crystal grain boundary mitigates the influence on the piezoelectric characteristics. When thickness of the crystal grain boundary is larger than 1 nm, clear glass phase is formed in the crystal grain boundary. Presence of the glass phase in the crystal grain boundary increases the resistivity of the grain boundary and therefore makes microscopic insulation breakdown likely to occur in the crystal grain boundary. Therefore, it is preferable that Si exists in the crystal grain boundary in the form of individual molecules rather than glass phase.

In order to increase the mechanical strength, it is preferable that mean crystal grain size A of the piezoelectric ceramic material is in a range from 0.5 to 5 μm and standard deviation B of the grain sizes satisfies the condition that B/A is not larger than 0.5, mean void size C of the piezoelectric ceramic material is in a range from 0.5 to 5 μm and standard deviation D of the void sizes satisfies the condition that D/C is not larger than 0.25, while the void ratio is 5% or less. When these conditions are satisfied, the material becomes stronger to impact applied from the outside and to fatigue. Destruction of piezoelectric ceramic material due to rapid increase of leakage current known as the avalanche destruction is caused by structural defects such as cracks or voids. When the porcelain has uniform microstructure, it makes an actuator, for example, that has high reliability because chronic change in the volumetric specific resistance is made smaller during continuous operation.

When the grain size increases, the porcelain tends to have lower strength to breakage. When the mean crystal grain size A of the piezoelectric ceramic material exceeds 5 μm, it becomes more likely to break due to impact applied from the outside or fatigue and deteriorate in specific resistance, thus resulting in lower reliability. It is difficult, on the other hand, to control the mean crystal grain size A of the porcelain below 0.5 μm, because of the problems related to the manufacturing process such as preparation of stock material having smaller particle size and the firing temperature. Accordingly, that mean crystal grain size of the porcelain is preferably in a range from 1 to 3 μm.

When the ratio B/A of standard deviation B to the mean crystal grain size A of the porcelain is larger than 0.5, the porcelain cannot have uniform microstructure due to large defects and large crystal grains contained therein. Thus it becomes more likely to break due to impact applied from the outside or fatigue and deteriorate in specific resistance, thus resulting in lower reliability.

Since mean crystal grain size of the porcelain is in a range from 0.5 to 5 μm, mean void size C in the porcelain is also in a range from 0.5 to 5 μm. As the defects become smaller, the material becomes less likely to break due to impact applied from the outside or fatigue and deteriorate in specific resistance, thus resulting in higher reliability. When the mean void size exceeds 5 μm, it becomes more likely to break due to impact applied from the outside or fatigue and deteriorate in specific resistance, thus resulting in lower reliability. It is difficult, on the other hand, to control the mean void size below 0.5 μm, because of the problems related to the manufacturing process such as preparation of stock material having smaller particle size and the firing temperature.

When the ratio D/C of standard deviation D to the mean void size C of the porcelain is larger than 0.25, the porcelain contains large defects formed therein, and therefore it becomes more likely to break due to impact applied from the outside or fatigue and deteriorate in specific resistance, thus resulting in lower reliability. When the void ratio exceeds 5%, the porcelain becomes more likely to break due to impact applied from the outside or fatigue and deteriorate in specific resistance, thus resulting in lower reliability. It is desirable that there exist no voids to obtain better characteristics and reliability, although it is difficult to achieve in the practical manufacturing process.

A method for manufacturing the multi-layer piezoelectric device according to the present invention will be described below. First, column-like stack 1a is fabricated. Stock material of PZT is prepared by mixing predetermined quantities of high purity powders of PbO, $ZrO_2$, $TiO_2$, ZnO, $Nb_2O_5$, $WO_3$, $BaCO_3$, $SrCO_3$, $Yb_2O_3$ and $SiO_2$ in wet process by means of ball mill or the like for 10 to 24 hours. Then after dewatering and drying the mixture, the mixture is calcined at a temperature in a range from 800 to 900° C. for a period of 1 to 3 hours. The calcined material is then crushed in wet process by means of ball mill or the like so as to achieve a particle size distribution of $D_{50}$ in a range of 0.5±0.2 μm and $D_{90}$ less than 0.8 μm. The calcined powder of piezoelectric ceramic material such as the crushed PZT or the like, a binder made of an organic polymer such as acrylic resin or butyral resin and a plasticizer such as DBP (dibutyl phthalate) or DOP (dioctyl phthalate) are mixed to form a slurry which is formed into a ceramic green sheet that would become the piezoelectric layer 1 by a known method such as doctor blade process or calender roll process or other tape molding method.

Then an Ag—Pd or Pt powder, a binder and a plasticizer are mixed to prepare an electrically conductive paste which is applied onto the top surface of the ceramic green sheet by screen printing or the like to a thickness of 1 to 40 μm.

A plurality of the green sheets having the electrically conductive paste printed thereon are stacked one on another, with the stack being heated at a predetermined temperature to remove the binder. Then the stack is fired at a temperature in a range from 900 to 1200° C. thereby to make the column-like stack 1a.

The method of making the column-like stack 1a is not limited to that described above, and any manufacturing method may be employed as long as the column-like stack 1a can be made in such a constitution as a plurality of the piezoelectric layers and a plurality of the internal electrodes are stacked alternately one on another.

Then a groove is formed on the side face of the column-like stack 1a in every other layer by means of a dicing apparatus or the like.

Next the electrically conductive silver-glass paste is bonded by baking at a temperature in a range from 550 to 700° C. so as to form the external electrode 4.

Then the column-like stack 1a having the external electrodes 4 formed thereon is immersed in a silicone rubber solution while deaerating the silicone rubber solution by evacuation, so as to fill the groove of the column-like stack 1a with the silicone rubber. Then the column-like stack 1a is pulled out of the silicone rubber solution and is coated with the silicone rubber on the side faces thereof. Then the silicon rubber that fills the groove and covers the side faces of the column-like stack 1a is hardened.

Then lead wires 5 are connected to the external electrodes 4, thereby completing the multi-layer piezoelectric device of the present invention.

DC voltage of 0.1 to 3 kV/mm is applied between the pair of external electrodes 4 via the lead wires 5 so as to apply polarization treatment to the column-like stack 1a, thereby to complete the multi-layer piezoelectric actuator. When the lead wires 5 are connected to an external voltage source and the voltage is supplied via the lead wires 5 and the external electrodes 4 to the internal electrodes 2, the piezoelectric layers 1 undergo a significant amount of displacement by the reverse piezoelectric effect, so as to drive, for example, an automobile fuel injection valve that supplies fuel to an engine.

In the first through tenth embodiments described above, it is preferable that the internal electrode 2 includes voids and the voids occupy 5 to 70% of cross sectional area of the internal electrode 2 (this ratio will hereinafter be referred to as the void ratio).

By using the internal electrodes 2 that include voids to constitute the multi-layer piezoelectric device, it is made possible to obtain the multi-layer piezoelectric device having high durability. When the void ratio in the internal electrodes 2 is less than 5%, greater restrictive force is exerted on the displacement of the piezoelectric layer, with smaller effect of the presence of the voids. When the void ratio in the internal electrodes 2 is more than 70%, electrical conductivity of the internal electrodes 2 decreases and the strength decreases, which is not desirable. In order to improve the durability of the device, void ratio in the internal electrodes 2 is preferably from 7 to 70%. Void ratio in the internal electrodes 2 is more preferably from 10 to 60%, which enables it to maintain a large amount of displacement and achieve high durability.

The void ratio in the internal electrodes 2 refers to the ratio of area occupied by the voids to the total cross sectional area of the internal electrode 2, as described above, and can be determined as follows.

In a longitudinal section of the multi-layer piezoelectric device cut along a direction parallel to the stacking direction, total cross sectional area of the internal electrode 2 exposed in the longitudinal section and the area occupied by the voids are measured, for example, under a microscope. From these areas, void ratio in the internal electrode 2 is calculated as (area occupied by voids/total cross sectional area)×100.

The internal electrode 2 that includes the voids can be manufactured as follows.

First, a metal powder that constitutes the internal electrode 2 is prepared from two or more kinds of materials having different melting points so that voids are formed in the internal electrode 2 after firing. An alloy may be used as the metallic material depending on the purpose.

The metal powder that constitutes the internal electrode 2 is calcined at a temperature that is not lower than that of the metal having the lowest melting point and is not higher than that of the metal having the highest melting point among the metal powder that constitutes the internal electrode 2. When calcined at such a temperature, metal or alloy among the metal powder that constitutes the internal electrode 2 that has been melted moves between metal particles that have not been melted due to capillary effect thus leaving voids behind. This method allows it to set the void ratio in the internal electrode 2 to a desired level by adjusting the mixing proportions and temperature of the metal powder that constitutes the internal electrode 2.

The voids in the internal electrode 2 may also be formed by making use of small clearance that is formed between the metal powder particles when controlling the electrically conductive paste used in forming the internal electrode 2, or by making use of clearance that is formed as the binder contained in the electrically conductive paste is burned out.

Alternatively, the voids in the internal electrode 2 may also be formed by adding a material, that has low wettability with regards to the materials that constitute the internal electrode 2, to the electrically conductive paste used in forming the internal electrode 2, or by coating the green sheet of the piezoelectric material, whereon the electrically conductive paste of the internal electrode 2 is to be printed, with a material that has low wettability with regards to the materials that constitute the internal electrode 2. For the material that has low wettability with regards to the materials that constitute the internal electrode 2, for example, BN can be used.

The first through tenth embodiments have been described above, exemplifying the multi-layer piezoelectric devices having specific constitutions. According to the present invention, various multi-layer piezoelectric devices can be constituted by combining various components described above. For example, the device having the constitution shown in FIGS. 4A, 4B and the piezoelectric layers, the internal electrodes or the external electrodes described in the first to ninth embodiment may be combined, or the device having the constitution shown in FIG. 1A and the piezoelectric ceramic material described in the tenth embodiment may be combined.

ELEVENTH EMBODIMENT

Figure 3:
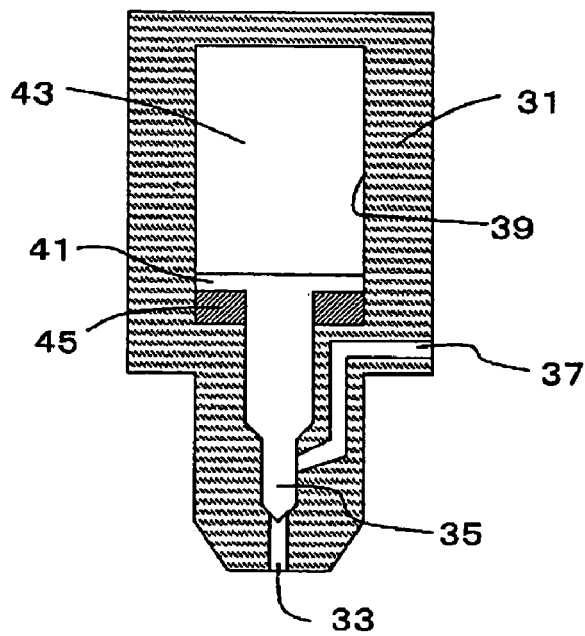
FIG. 3 is a perspective view of an injection apparatus according to the present invention.

FIG. 3 shows an injection apparatus according to the eleventh embodiment of the present invention, where a container 31 has an injection hole 33 formed at one end thereof, and a needle valve 35 that can open and close the injection hole 33 is housed in the container 31.

The injection hole 33 is provided with a fuel passage 37 in communication therewith. The fuel passage 37 is connected to a fuel source that is provided outside of the apparatus, so as to receive supply of fuel at a high pressure that remains always constant. When the needle valve 35 opens the injection hole 33, the fuel that fills the fuel passage 37 is injected at a predetermined level of high pressure into a fuel chamber of an internal combustion engine that is not shown in the drawings.

The needle valve 35 has an enlarged top portion of a larger diameter so as to serve as a piston 41 that makes sliding motion in a cylinder 39 that is formed in the container 31. The piezoelectric actuator 43 is housed in the container 31.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be injected.

The present invention relates to the multi-layer piezoelectric device and the injection apparatus, but is not limited to the embodiments described above. For example, the present invention can be applied to a fuel injection apparatus of automobile engine, liquid ejecting apparatus of ink jet printer or the like or a drive unit used in precision positioning device or vibration preventing device for an optical apparatus, or to sensor devices such as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, and is also applicable to other purposes, as long as the piezoelectric characteristic is utilized.

EXAMPLES

Example 1

A multi-layer piezoelectric actuator comprising the multi-layer piezoelectric device of the present invention was fabricated as described below.

First, a calcined powder of a piezoelectric ceramic material constituted from lead titanate zirconate ($PbZrO_3$—$PbTiO_3$) as the main component, a binder and a plasticizer were mixed to form a slurry which was formed into ceramic green sheets that would become the piezoelectric layer 11 having thickness of 150 μm by the doctor blade process.

An electrically conductive paste, prepared by adding a binder to the silver-palladium alloy made with an arbitrary composition, was applied to one side of the ceramic green sheet by screen printing method to a thickness of 3 μm. Then 300 pieces of the ceramic green sheets were stacked and fired at a temperature of 1000° C. $K_2CO_3$ or $Na_2CO_3$ powder was added to the stock materials of the piezoelectric layers 11, the internal electrodes 12 and the external electrodes 13.

Alkali metal contained in the multi-layer piezoelectric device thus made from the sintering material, in the piezoelectric layers, in the internal electrodes and in the external electrodes was detected by ICP analysis.

Then a groove measuring 50 μm in depth and 50 μm in width was formed at the end of the internal electrode located on the side face of the stack in every other layer, by means of a dicing apparatus.

Then 90% by volume of silver powder of flake-like particles having mean particle size of 2 μm and 10% by volume of amorphous glass powder having softening point of 640° C. containing silicon as the main component having mean particle size of 2 μm were mixed, and 8 weight parts of this mixture was added to 100 weight parts in total of binder, the silver powder and the glass powder, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet as measured by Archimedes method was 6.5 g/cm$^3$.

The sheet of the silver-glass paste was transferred onto the external electrode surface of the stack and was baked at 650° C. for 30 minutes, thereby forming the external electrode from the porous electrically conductive material having three-dimensional mesh structure. Measurement of void ratio of the external electrode by means of image analysis apparatus on a photograph of a cut surface of the external electrode showed a void ratio of 40%.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator using the multi-layer piezoelectric device as shown in FIG. 1.

When a DC voltage of 170 V was applied to the multi-layer piezoelectric device, it underwent a displacement of 45 μm in the direction of stacking. Operation test was conducted on this multi-layer piezoelectric device by applying an AC voltage varying between 0 V and +170 V at frequency of 150 Hz at room temperature.

Change in the amount of displacement (μm) of the multi-layer piezoelectric device after undergoing $1 \times 10^9$ cycles of operation was measured, and was compared with the displacement of the multi-layer piezoelectric device in the initial state before starting the continuous operation, so as to calculate the variation (%) of the amount of displacement and deterioration of the multi-layer piezoelectric device. The results are shown in Tables 1 through 4. Table 1 shows the amounts of displacement with various kinds of alkali metal contained in the multi-layer piezoelectric device, Table 2 shows the amounts of displacement with various kinds of alkali metal contained in the piezoelectric layers, Table 3 shows the amounts of displacement with various kinds of alkali metal contained in the internal electrode, and Table 4 shows the amounts of displacement with various kinds of alkali metal contained in the external electrode.

TABLE 1

Table 1-1

| No | Alkali metal content in piezoelectric layer (ppm) | Kind of alkali metal | Amount of initial displacement (μm) = A |
|---|---|---|---|
| *1-1 | 2 | Na | Piezoelectric material could not be sintered. |
| 1-2 | 5 | Na | 45.0 |
| 1-3 | 30 | Na | 45.0 |
| 1-4 | 50 | Na | 45.0 |
| 1-5 | 70 | Na | 45.0 |
| 1-6 | 100 | Na | 45.0 |
| 1-7 | 250 | Na | 45.0 |
| 1-8 | 500 | Na | 45.0 |
| *1-9 | 750 | Na | 45.0 |
| 1-10 | 5 | K | 45.0 |
| 1-11 | 30 | K | 45.0 |
| 1-12 | 50 | K | 45.0 |
| 1-13 | 70 | K | 45.0 |
| 1-14 | 100 | K | 45.0 |
| 1-15 | 250 | K | 45.0 |
| 1-16 | 500 | K | 45.0 |
| *1-17 | 750 | K | 45.0 |

Table 1-2

| No | Amount of displacement (μm) after continuous operation ($1 \times 10^9$) = B | Ratio (%) of change in amount of displacement after continuous operation to initial displacement = $\mid (A - B)/A \times 100 \mid$ |
|---|---|---|
| *1-1 | — | — |
| 1-2 | 45.0 | 0.0 |
| 1-3 | 44.9 | 0.2 |
| 1-4 | 44.8 | 0.4 |
| 1-5 | 44.6 | 0.9 |
| 1-6 | 44.6 | 0.9 |
| 1-7 | 44.5 | 1.1 |
| 1-8 | 44.4 | 1.3 |
| *1-9 | 44.0 | 2.2 |
| 1-10 | 45.0 | 0.0 |
| 1-11 | 44.9 | 0.2 |
| 1-12 | 44.8 | 0.4 |
| 1-13 | 44.6 | 0.9 |
| 1-14 | 44.6 | 0.9 |
| 1-15 | 44.5 | 1.1 |
| 1-16 | 44.4 | 1.3 |
| *1-17 | 44.0 | 2.2 |

*Out of the scope of the present invention.

TABLE 2

Table 2-1

| No | Alkali metal content in internal electrode (ppm) | Kind of alkali metal | Amount of initial displacement (μm) = A |
|---|---|---|---|
| *1-18 | 2 | Na | Piezoelectric material could not be sintered. |
| 1-19 | 5 | Na | 45.0 |
| 1-20 | 30 | Na | 45.0 |
| 1-21 | 50 | Na | 45.0 |
| 1-22 | 70 | Na | 45.0 |
| 1-23 | 100 | Na | 45.0 |
| 1-24 | 250 | Na | 45.0 |

TABLE 2-continued

| No | | | |
|---|---|---|---|
| 1-25 | 500 | Na | 45.0 |
| *1-26 | 750 | Na | 45.0 |
| 1-27 | 5 | K | 45.0 |
| 1-28 | 30 | K | 45.0 |
| 1-29 | 50 | K | 45.0 |
| 1-30 | 70 | K | 45.0 |
| 1-31 | 100 | K | 45.0 |
| 1-32 | 250 | K | 45.0 |
| 1-33 | 500 | K | 45.0 |
| **1-34 | 750 | K | 45.0 |

Table 2-2

| No | Amount of displacement (μm) after continuous operation (1 × 10$^9$) = B | Ratio (%) of change in amount of displacement after continuous operation to initial displacement = \| (A−B)/A × 100 \| |
|---|---|---|
| *1-18 | — | — |
| 1-19 | 45.0 | 0.0 |
| 1-20 | 44.9 | 0.2 |
| 1-21 | 44.8 | 0.4 |
| 1-22 | 44.6 | 0.9 |
| 1-23 | 44.6 | 0.9 |
| 1-24 | 44.5 | 1.1 |
| 1-25 | 44.4 | 1.3 |
| *1-26 | 44.0 | 2.2 |
| 1-27 | 45.0 | 0.0 |
| 1-28 | 44.9 | 0.2 |
| 1-29 | 44.8 | 0.4 |
| 1-30 | 44.6 | 0.9 |
| 1-31 | 44.6 | 0.9 |
| 1-32 | 44.5 | 1.1 |
| 1-33 | 44.4 | 1.3 |
| *1-34 | 44.0 | 2.2 |

TABLE 3

Table 3-1

| No. | Alkali metal content in external electrode (ppm) | Kind of alkali metal | Amount of initial displacement (μm) = A |
|---|---|---|---|
| *1-35 | 2 | Na | Piezoelectric material could not be sintered. |
| 1-36 | 5 | Na | 45.0 |
| 1-37 | 30 | Na | 45.0 |
| 1-38 | 50 | Na | 45.0 |
| 1-39 | 70 | Na | 45.0 |
| 1-40 | 100 | Na | 45.0 |
| 1-41 | 250 | Na | 45.0 |
| 1-42 | 500 | Na | 45.0 |
| *1-43 | 750 | Na | 45.0 |
| 1-44 | 5 | K | 45.0 |
| 1-45 | 30 | K | 45.0 |
| 1-46 | 50 | K | 45.0 |
| 1-47 | 70 | K | 45.0 |
| 1-48 | 100 | K | 45.0 |
| 1-49 | 250 | K | 45.0 |
| 1-50 | 500 | K | 45.0 |
| *1-51 | 750 | K | 45.0 |

Table 3-2

| No | Amount of displacement (μm) after continuous operation (1 × 10$^9$) = B | Ratio (%) of change in amount of displacement after continuous operation to initial displacement = \| (A − B)/A × 100 \| |
|---|---|---|
| *1-35 | — | — |
| 1-36 | 45.0 | 0.0 |
| 1-37 | 44.9 | 0.2 |
| 1-38 | 44.8 | 0.4 |
| 1-39 | 44.6 | 0.9 |
| 1-40 | 44.6 | 0.9 |
| 1-41 | 44.5 | 1.1 |
| 1-42 | 44.4 | 1.3 |
| *1-43 | 44.0 | 2.2 |
| 1-44 | 45.0 | 0.0 |
| 1-45 | 44.9 | 0.2 |
| 1-46 | 44.8 | 0.4 |
| 1-47 | 44.6 | 0.9 |
| 1-48 | 44.6 | 0.9 |
| 1-49 | 44.5 | 1.1 |
| 1-50 | 44.4 | 1.3 |
| *1-51 | 44.0 | 2.2 |

TABLE 4

Table 4-1

| No. | Alkali metal content in device (ppm) | Kind of alkali metal | Amount of initial displacement (μm) = A |
|---|---|---|---|
| *1-52 | 2 | Na | Piezoelectric material could not be sintered. |
| 1-53 | 5 | Na | 45.0 |
| 1-54 | 30 | Na | 45.0 |
| 1-55 | 50 | Na | 45.0 |
| 1-56 | 70 | Na | 45.0 |
| 1-57 | 100 | Na | 45.0 |
| 1-58 | 200 | Na | 45.0 |
| 1-59 | 300 | Na | 45.0 |
| *1-60 | 500 | Na | 45.0 |
| 1-61 | 5 | K | 45.0 |
| 1-62 | 30 | K | 45.0 |
| 1-63 | 50 | K | 45.0 |
| 1-64 | 70 | K | 45.0 |
| 1-65 | 100 | K | 45.0 |
| 1-66 | 200 | K | 45.0 |
| 1-67 | 300 | K | 45.0 |
| *1-68 | 500 | K | 45.0 |

Table 4-2

| No | Amount of displacement (μm) after continuous operation (1 × 10$^9$) = B | Ratio (%) of change in amount of displacement after continuous operation to initial displacement = \| (A − B)/A × 100 \| |
|---|---|---|
| *1-52 | — | — |
| 1-53 | 45.0 | 0.0 |
| 1-54 | 44.9 | 0.2 |
| 1-55 | 44.8 | 0.4 |
| 1-56 | 44.6 | 0.9 |
| 1-57 | 44.6 | 0.9 |
| 1-58 | 44.5 | 1.1 |
| 1-59 | 44.4 | 1.3 |
| *1-60 | 44.0 | 2.2 |
| 1-61 | 45.0 | 0.0 |
| 1-62 | 44.9 | 0.2 |
| 1-63 | 44.8 | 0.4 |
| 1-64 | 44.6 | 0.9 |
| 1-65 | 44.6 | 0.9 |
| 1-66 | 44.5 | 1.1 |
| 1-67 | 44.4 | 1.3 |
| *1-68 | 44.0 | 2.2 |

*Out of the scope of the present invention.

From the tables, it can be seen that the ratio of change in displacement (%) rapidly increases and deterioration proceeds when alkali metal content in the multi-layer piezoelectric device exceeds 300 ppm. When the alkali metal content is less than 5 ppm, piezoelectric layer could not be sintered and function of the piezoelectric layer could not be achieved.

Accordingly, a piezoelectric actuator having excellent durability and high reliability that does not cause malfunction of the device can be provided as the amount of displacement does not substantially change even when the multi-layer piezoelectric device is operated over a long period of time, by controlling the alkali metal content in the multi-layer piezoelectric device in a range from 5 ppm to 300 ppm.

This applies similarly to the contents of alkali metal in the piezoelectric layers, in the internal electrodes and in the external electrodes.

Example 2

Experiments were conducted similarly to Example 1, except for adding titanium chloride to the piezoelectric layers and adding AgCl to the stock materials of the internal electrodes and the external electrodes. Halogen element contents in the piezoelectric layers, the internal electrodes and the external electrodes of the multi-layer piezoelectric device thus obtained were detected by ion chromatography. Results of the experiments are shown in Tables 5 through 8.

TABLE 5

Table 5-1

| No. | Halogen element content in piezoelectric layer (ppm) | Kind of halogen element | Amount of initial displacement (μm) = A |
|---|---|---|---|
| *2-1 | 2 | Cl | Piezoelectric material could not be sintered. |
| 2-2 | 5 | Cl | 45.0 |
| 2-3 | 20 | Cl | 45.0 |
| 2-4 | 50 | Cl | 45.0 |
| 2-5 | 70 | Cl | 45.0 |
| 2-6 | 100 | Cl | 45.0 |
| 2-7 | 500 | Cl | 45.0 |
| 2-8 | 1500 | Cl | 45.0 |
| *2-9 | 2000 | Cl | 45.0 |
| 2-10 | 5 | Br | 45.0 |
| 2-11 | 20 | Br | 45.0 |
| 2-12 | 50 | Br | 45.0 |
| 2-13 | 70 | Br | 45.0 |
| 2-14 | 100 | Br | 45.0 |
| 2-15 | 500 | Br | 45.0 |
| 2-16 | 1500 | Br | 45.0 |
| *2-17 | 2000 | Br | 45.0 |

Table 5-2

| No | Amount of displacement (μm) after continuous operation ($1 \times 10^9$) = B | Ratio (%) of change in amount of displacement after continuous operation to initial displacement = $\mid (A - B)/A \times 100 \mid$ |
|---|---|---|
| *2-1 | — | — |
| 2-2 | 45.0 | 0.0 |
| 2-3 | 44.9 | 0.2 |
| 2-4 | 44.8 | 0.4 |
| 2-5 | 44.6 | 0.9 |
| 2-6 | 44.6 | 0.9 |
| 2-7 | 44.5 | 1.1 |
| 2-8 | 44.4 | 1.3 |
| *2-9 | 44.0 | 2.2 |
| 2-10 | 45.0 | 0.0 |
| 2-11 | 44.9 | 0.2 |
| 2-12 | 44.8 | 0.4 |
| 2-13 | 44.6 | 0.9 |
| 2-14 | 44.6 | 0.9 |
| 2-15 | 44.5 | 1.1 |
| 2-16 | 44.4 | 1.3 |
| *2-17 | 44.0 | 2.2 |

*Out of the scope of the present invention.

TABLE 6

Table 6-1

| No | Halogen element content in internal electrode (ppm) | Kind of halogen element | Amount of initial displacement (μm) = A |
|---|---|---|---|
| *2-18 | 2 | Cl | Piezoelectric material could not be sintered. |
| 2-19 | 5 | Cl | 45.0 |
| 2-20 | 20 | Cl | 45.0 |
| 2-21 | 50 | Cl | 45.0 |
| 2-22 | 70 | Cl | 45.0 |
| 2-23 | 100 | Cl | 45.0 |
| 2-24 | 500 | Cl | 45.0 |
| 2-25 | 1500 | Cl | 45.0 |
| *2-26 | 2000 | Cl | 45.0 |
| 2-27 | 5 | Br | 45.0 |
| 2-28 | 20 | Br | 45.0 |
| 2-29 | 50 | Br | 45.0 |
| 2-30 | 70 | Br | 45.0 |
| 2-31 | 100 | Br | 45.0 |
| 2-32 | 500 | Br | 45.0 |
| 2-33 | 1500 | Br | 45.0 |
| *2-34 | 2000 | Br | 45.0 |

Table 6-2

| No | Amount of displacement (μm) after continuous operation ($1 \times 10^9$) = B | Ratio (%) of change in amount of displacement after continuous operation to initial displacement = $\mid (A - B)/A \times 100 \mid$ |
|---|---|---|
| *2-18 | — | — |
| 2-19 | 45.0 | 0.0 |
| 2-20 | 44.9 | 0.2 |
| 2-21 | 44.8 | 0.4 |
| 2-22 | 44.6 | 0.9 |
| 2-23 | 44.6 | 0.9 |
| 2-24 | 44.5 | 1.1 |
| 2-25 | 44.4 | 1.3 |
| *2-26 | 44.0 | 2.2 |
| 2-27 | 45.0 | 0.0 |
| 2-28 | 44.9 | 0.2 |
| 2-29 | 44.8 | 0.4 |
| 2-30 | 44.6 | 0.9 |
| 2-31 | 44.6 | 0.9 |
| 2-32 | 44.5 | 1.1 |
| 2-33 | 44.4 | 1.3 |
| *2-34 | 44.0 | 2.2 |

*Out of the scope of the present invention.

TABLE 7

Table 7-1

| No | Halogen element content in external electrode (ppm) | Kind of halogen element | Amount of initial displacement (μm) = A |
|---|---|---|---|
| *2-35 | 2 | Cl | Piezoelectric material could not be sintered. |
| 2-36 | 5 | Cl | 45.0 |
| 2-37 | 20 | Cl | 45.0 |
| 2-38 | 50 | Cl | 45.0 |
| 2-39 | 70 | Cl | 45.0 |

TABLE 7-continued

| No | | | |
|---|---|---|---|
| 2-40 | 100 | Cl | 45.0 |
| 2-41 | 500 | Cl | 45.0 |
| 2-42 | 1500 | Cl | 45.0 |
| *2-43 | 2000 | Cl | 45.0 |
| 2-44 | 5 | Br | 45.0 |
| 2-45 | 20 | Br | 45.0 |
| 2-46 | 50 | Br | 45.0 |
| 2-47 | 70 | Br | 45.0 |
| 2-48 | 100 | Br | 45.0 |
| 2-49 | 500 | Br | 45.0 |
| 2-50 | 1500 | Br | 45.0 |
| *2-51 | 2000 | Br | 45.0 |

Table 7-2

| No | Amount of displacement (μm) after continuous operation ($1 \times 10^9$) = B | Ratio (%) of change in amount of displacement after continuous operation to initial displacement = $\|(A - B)/A \times 100\|$ |
|---|---|---|
| *2-35 | — | — |
| 2-36 | 45.0 | 0.0 |
| 2-37 | 44.9 | 0.2 |
| 2-38 | 44.8 | 0.4 |
| 2-39 | 44.6 | 0.9 |
| 2-40 | 44.6 | 0.9 |
| 2-41 | 44.5 | 1.1 |
| 2-42 | 44.4 | 1.3 |
| *2-43 | 44.0 | 2.2 |
| 2-44 | 45.0 | 0.0 |
| 2-45 | 44.9 | 0.2 |
| 2-46 | 44.8 | 0.4 |
| 2-47 | 44.6 | 0.9 |
| 2-48 | 44.6 | 0.9 |
| 2-49 | 44.5 | 1.1 |
| 2-50 | 44.4 | 1.3 |
| *2-51 | 44.0 | 2.2 |

TABLE 8

Table 8-1

| No | Halogen element content in device (ppm) | Kind of halogen element | Amount of initial displacement (μm) = A |
|---|---|---|---|
| *2-52 | 2 | Cl | Piezoelectric layer could not be sintered. |
| 2-53 | 5 | Cl | 45.0 |
| 2-54 | 20 | Cl | 45.0 |
| 2-55 | 50 | Cl | 45.0 |
| 2-56 | 70 | Cl | 45.0 |
| 2-57 | 100 | Cl | 45.0 |
| 2-58 | 500 | Cl | 45.0 |
| 2-59 | 1000 | Cl | 45.0 |
| *2-60 | 1500 | Cl | 45.0 |
| 2-61 | 5 | Br | 45.0 |
| 2-62 | 20 | Br | 45.0 |
| 2-63 | 50 | Br | 45.0 |
| 2-64 | 70 | Br | 45.0 |
| 2-65 | 100 | Br | 45.0 |
| 2-66 | 500 | Br | 45.0 |
| 2-67 | 1000 | Br | 45.0 |
| *2-68 | 1500 | Br | 45.0 |

Table 8-2

| No | Amount of displacement (μm) after continuous operation ($1 \times 10^9$) = B | Ratio (%) of change in amount of displacement after continuous operation to initial displacement = $\|(A - B)/A \times 100\|$ |
|---|---|---|
| *2-52 | — | — |
| 2-53 | 45.0 | 0.0 |
| 2-54 | 44.9 | 0.2 |
| 2-55 | 44.8 | 0.4 |
| 2-56 | 44.6 | 0.9 |
| 2-57 | 44.6 | 0.9 |
| 2-58 | 44.5 | 1.1 |
| 2-59 | 44.4 | 1.3 |
| *2-60 | 44.0 | 2.2 |
| 2-61 | 45.0 | 0.0 |
| 2-62 | 44.9 | 0.2 |
| 2-63 | 44.8 | 0.4 |
| 2-64 | 44.6 | 0.9 |
| 2-65 | 44.6 | 0.9 |
| 2-66 | 44.5 | 1.1 |
| 2-67 | 44.4 | 1.3 |
| *2-68 | 44.0 | 2.2 |

From the tables, it can be seen that the ratio of change in displacement (%) rapidly increases and deterioration proceeds when halogen element content in the multi-layer piezoelectric device exceeds 1000 ppm. When the halogen element content is less than 5 ppm, piezoelectric layer could not be sintered and function of the piezoelectric layer could not be achieved. Accordingly, a piezoelectric actuator having excellent durability and high reliability that does not cause malfunction of the device can be provided as the amount of displacement does not substantially change even when the multi-layer piezoelectric device is operated over a long period of time, by controlling the alkali metal content in the multi-layer piezoelectric device in a range from 5 ppm to 300 ppm.

This applies similarly to the contents of halogen element in the piezoelectric layers, in the internal electrodes and in the external electrodes.

Example 3

In Example 3, experiments were conducted similarly to Example 1, by using multi-layer piezoelectric device having different compositions of the internal electrode. The results are shown in Table 9.

TABLE 9

Table 9-1

| No | Pd content in metal of internal electrode (% by weight) | Pt content in metal of internal electrode (% by weight) | Ag content in metal of internal electrode (% by weight) | Ratio (%) of change in amount of displacement after continuous operation to initial displacement |
|---|---|---|---|---|
| 3-1 | 0 | 0 | 100 | Destroyed due to migration. |
| 3-2 | 0.001 | 0 | 99.999 | 0.7 |
| 3-3 | 0.01 | 0 | 99.99 | 0.7 |
| 3-4 | 0.1 | 0 | 99.9 | 0.4 |
| 3-5 | 0.5 | 0 | 99.5 | 0.2 |
| 3-6 | 1 | 0 | 99 | 0.2 |
| 3-7 | 2 | 0 | 98 | 0 |

TABLE 9-continued

| 3-8 | 4 | 1 | 95 | 0 |
| 3-9 | 5 | 0 | 95 | 0 |
| 3-10 | 8 | 0 | 92 | 0 |
| 3-11 | 9 | 0 | 91 | 0.2 |
| 3-12 | 9.5 | 0 | 90.5 | 0.2 |
| 3-13 | 10 | 0 | 90 | 0.4 |
| 3-14 | 15 | 0 | 85 | 0.7 |
| 3-15 | 20 | 0 | 80 | 0.9 |
| 3-16 | 30 | 0 | 70 | 0.9 |

Table 9-2

| No | Other metal of internal electrode (% by weight) | Ratio (%) of change in amount of displacement after continuous operation to initial displacement |
| --- | --- | --- |
| 3-17 | Cu 100% | 0.2 |
| 3-18 | Cu 99.99% | 0.1 |
| 3-19 | Ni 100% | 0.4 |

The above table shows that the multi-layer piezoelectric device was destroyed due to silver migration disabling continuous operation when the internal electrodes 12 of No. 3-1 were formed from 100% silver. Metal compounds in the internal electrodes 12 of Nos. 3-15 and 3-16 contained more than 15% by weight of group VIII metal and less than 85% by weight of group Ib metal, thus resulting in increasing deterioration during continuous operation and decreasing durability of the multi-layer piezoelectric actuator.

Metal compounds in the internal electrodes 12 of Nos. 3-2 through 3-14 were controlled so that proportion M1 (% by weight) of the group VIII metal and proportion M2 (% by weight) of the group Ib metal satisfy the relations $0 \leq M1 \leq 15$, $85 \leq M2 \leq 100$ and $M1+M2=100$. This enabled it to decrease the specific resistance of the internal electrode and suppress heat from being generated from the internal electrode even when operated continuously, thus achieving the multi-layer piezoelectric actuator having the amount of displacement of the device being stabilized.

The present invention is not limited to the Examples described above, and various modifications may be made within the scope of the present invention.

Examples 4 to 6

In Examples 4 through 6, multi-layer piezoelectric actuators comprising the multi-layer piezoelectric device were made as described below.

First, a calcined powder of a piezoelectric ceramic material constituted from lead titanate zirconate ($PbZrO_3$—$PbTiO_3$) as the main component, a binder and a plasticizer were mixed to form a slurry which was formed into ceramic green sheets that would become the piezoelectric layer 11 having thickness of 150 μm by the doctor blade process.

An electrically conductive paste, prepared by adding a binder to the silver-palladium alloy made with an arbitrary composition, was applied to one side of the ceramic green sheet by screen printing method to a thickness of 3 μm. Then 300 pieces of the ceramic green sheets were stacked and fired at a temperature of 1000° C.

Then a groove measuring 50 μm in depth and 50 μm in width was formed at the end of the internal electrode located on the side face of the stack in every other layer, by means of a dicing apparatus.

Then 90% by volume of silver powder of flake-like particles having mean particle size of 2 μm and 10% by volume of amorphous glass powder having softening point of 640° C. containing silicon as the main component having mean particle size of 2 μm were mixed, and 8 weight parts of this mixture was added to 100 weight parts in total of binder, the silver powder and the glass powder, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet as measured by Archimedes method was 6.5 g/cm³.

The sheet of the silver-glass paste was transferred onto the external electrode 15 surface of the stack 13 and was baked at 650° C. for 30 minutes, thereby forming the external electrode 15 from the porous electrically conductive material having three-dimensional mesh structure. Measurement of void ratio of the external electrode 15 by means of image analysis apparatus on a photograph of a cut surface of the external electrode 15 showed a void ratio of 40%.

Then lead wires were connected to the external electrodes 15, and DC electric field of 3 kV/mm was applied between the positive and negative external electrodes 15 via the lead wires so as to apply polarization treatment for 15 minutes, thereby to complete the multi-layer piezoelectric actuator using the multi-layer piezoelectric device as shown in FIG. 1.

Example 4

The multi-layer piezoelectric actuator of the present invention was made by the manufacturing method wherein device resistance and induction loss (tan δ) of the piezoelectric layer 11 were controlled. Changes in the device dimension and temperature before and after continuous operation of the multi-layer piezoelectric actuator were measured, and the relation thereof with the change in the amount of displacement before and after continuous operation of the multi-layer piezoelectric actuator was investigated.

As Comparative Example, sample was made of which change in device dimension before and after continuous operation of the multi-layer piezoelectric actuator exceeded 1%.

When a DC voltage of 170 V was applied to the multi-layer piezoelectric actuator made as described above, all the multi-layer piezoelectric actuators underwent displacement of 45 μm in the direction of stacking. Operation test was conducted on the multi-layer piezoelectric actuators by applying an AC voltage varying between 0 V and +170 V at frequency of 150 Hz at room temperature to carry out continuous operation of $1 \times 10^9$ cycles. The results are shown in Table 10.

TABLE 10

Table 10-1

| No. | Resistance of internal electrode normalized to resistance of 100% silver | Amount of initial displacement (μm) = A |
| --- | --- | --- |
| 4-1 | 2 | 45.0 |
| 4-2 | 3 | 45.0 |
| 4-3 | 4 | 45.0 |
| 4-4 | 5 | 45.0 |
| 4-5 | 8 | 45.0 |
| 4-6 | 10 | 45.0 |

TABLE 10-continued

| | | |
|---|---|---|
| 4-7 | 5 | 45.0 |
| *4-8 | 10 | 45.0 |

Table 10-2

| No. | Change (%) in device temperature after continuous operation (1 × $10^9$ cycles) | Change (%) in device dimension after continuous operation (1 × $10^9$ cycles) | Amount of displacement (μm) of device after continuous operation (1 × $10^9$ cycles) = B |
|---|---|---|---|
| 4-1 | 0.0 | 0.0 | 45.0 |
| 4-2 | 0.5 | 0.1 | 44.9 |
| 4-3 | 0.9 | 0.2 | 44.8 |
| 4-4 | 1.4 | 0.3 | 44.7 |
| 4-5 | 2.3 | 0.5 | 44.5 |
| 4-6 | 3.2 | 0.7 | 44.1 |
| 4-7 | 4.5 | 1.0 | 43.5 |
| *4-8 | 9.0 | 2.0 | Destroyed by thermal excursion. |

From Table 10, it can be seen that change in device dimension of sample No. 4-8 made as Comparative Example before and after continuous operation exceeded 1%, and therefore the amount of displacement after continuous operation significantly decreased. Furthermore, since local heat generation occurred in the junction between the internal electrode 12 and the external electrode 15, the multi-layer piezoelectric actuator was destroyed by thermal excursion.

Samples Nos. 4-1 through 4-7 made in Examples of the present invention were multi-layer piezoelectric actuators made to control the change in device dimension before and after continuous operation within 1%. Thus these multi-layer piezoelectric actuators exhibited effective amount of displacement that is required thereof, without significant decrease in the amount of displacement after continuous operation of 1×$10^9$ cycles. The multi-layer piezoelectric actuators also showed excellent durability without undergoing thermal excursion and malfunction.

Example 5

The multi-layer piezoelectric actuator of the present invention was made by the manufacturing method described above wherein device resistance and induction loss (tan δ) of the piezoelectric layer 11 were controlled. Changes in thickness of the internal electrode 12 and in device temperature before and after continuous operation of the multi-layer piezoelectric actuator were measured, and the relation thereof with degree of deterioration represented by the change in the amount of displacement before and after continuous operation of the multi-layer piezoelectric actuator was investigated.

The degree of deterioration is defined as the ratio of the amount of displacement after a predetermined number of cycles (the amount of displacement after continuous operation) of the multi-layer piezoelectric actuator to the amount of displacement before continuous operation (the amount of displacement in the initial state). This value enables it to examine the progress of deterioration that is caused by continuous operation of the multi-layer piezoelectric actuator.

As Comparative Example, sample was made of which change in thickness of the internal electrode 12 before and after continuous operation of the multi-layer piezoelectric actuator exceeded 5%.

When a DC voltage of 170 V was applied to the multi-layer piezoelectric actuators made as described above, all the multi-layer piezoelectric actuators underwent displacement of 45 μm in the direction of stacking. Operation test was conducted on the multi-layer piezoelectric actuators by applying an AC voltage varying between 0 V and +170 V at frequency of 150 Hz at room temperature to carry out continuous operation of 1×$10^9$ cycles. The results are shown in Table 11.

TABLE 11

Table 11-1

| No | Resistance of internal electrode normalized to resistance of 100% silver | Induction loss tan δ (%) of the piezoelectric material | Amount of initial displacement = A | Change (%) in device temperature before and after continuous operation (1 × $10^9$ cycles) |
|---|---|---|---|---|
| 5-1 | 2 | 0.5 | 45.0 | 0.0 |
| 5-2 | 3 | 0.5 | 45.0 | 0.5 |
| 5-3 | 4 | 0.5 | 45.0 | 0.9 |
| 5-4 | 5 | 0.5 | 45.0 | 1.4 |
| 5-5 | 8 | 0.5 | 45.0 | 2.3 |
| 5-6 | 10 | 0.5 | 45.0 | 3.2 |
| 5-7 | 5 | 1.5 | 45.0 | 4.5 |
| *5-8 | 8 | 1.5 | 45.0 | 5.4 |
| *5-9 | 10 | 2.5 | 45.0 | 9.0 |

Table 11-2

| No. | Change (%) in thickness of internal electrode before and after continuous operation (1 × $10^9$ cycles) | Amount of displacement (μm) after continuous operation (1 × $10^9$ cycles) = B | Ratio (%) of change in amount of displacement after continuous operation to the initial state = \| (A − B)/A × 100 \| = Degree of deterioration (%) |
|---|---|---|---|
| 5-1 | 0.0 | 45.0 | 0 |
| 5-2 | 0.5 | 44.9 | 0.2 |
| 5-3 | 1.0 | 44.8 | 0.4 |
| 5-4 | 1.5 | 44.7 | 0.7 |
| 5-5 | 2.5 | 44.5 | 1.1 |
| 5-6 | 3.5 | 44.1 | 2.0 |
| 5-7 | 5.0 | 43.5 | 3.3 |
| *5-8 | 6.0 | 41.4 | 8.0 |
| *5-9 | 10.0 | Destroyed by thermal excursion. | — |

From Table 11, it can be seen that change in thickness of the internal electrode 12 of samples Nos. 5-8 and 5-9 made as Comparative Example before and after continuous operation exceeded 5%, and therefore the amount of displacement after continuous operation significantly decreased, while the degree of deterioration increased. In sample No. 5-9, oxidation swelling was accelerated by significant heat generation from the internal electrode 12, resulting in thermal excursion that destroyed the multi-layer piezoelectric actuator.

Samples Nos. 5-1 through 5-7 made in Examples of the present invention were multi-layer piezoelectric actuators that were constituted to control the change in thickness of the internal electrode 12 before and after continuous operation within 5%. Thus these multi-layer piezoelectric actuators exhibited effective amount of displacement that is required thereof, without significant decrease in the amount of displacement after continuous operation of 1×$10^9$ cycles. The multi-layer piezoelectric actuators also showed excellent durability without undergoing thermal excursion and malfunction.

Example 6

Maximum change in the amount of displacement of the multi-layer piezoelectric actuators having the internal electrodes 12 formed in different compositions, that were made by the manufacturing method described above, was measured during continuous operation, and relationship between the composition of the internal electrode 12 and the degree of deterioration of the multi-layer piezoelectric actuators after continuous operation was examined.

When a DC voltage of 170 V was applied to the multi-layer piezoelectric actuators made as described above, all the multi-layer piezoelectric actuators underwent displacement of 45 μm in the direction of stacking. Operation test was conducted on the multi-layer piezoelectric actuators by applying an AC voltage varying between 0 V and +170 V at frequency of 150 Hz at room temperature to carry out continuous operation of $1 \times 10^9$ cycles. The results are shown in Table 12.

TABLE 12

Table 12-1

| No | Pd content in metal of internal electrode (% by weight) | Pt content in metal of internal electrode (% by weight) | Ag content in metal of internal electrode (% by weight) |
|---|---|---|---|
| 6-1 | 0 | 0 | 100 |
| 6-2 | 0.001 | 0 | 99.999 |
| 6-3 | 0.01 | 0 | 99.99 |
| 6-4 | 0.1 | 0 | 99.9 |
| 6-5 | 0.5 | 0 | 99.5 |
| 6-6 | 1 | 0 | 99 |
| 6-7 | 2 | 0 | 98 |
| 6-8 | 4 | 1 | 95 |
| 6-9 | 5 | 0 | 95 |
| 6-10 | 8 | 0 | 92 |
| 6-11 | 9 | 0 | 91 |
| 6-12 | 9.5 | 0 | 90.5 |
| 6-13 | 10 | 0 | 90 |
| 6-14 | 15 | 0 | 85 |
| 6-15 | 0 | 0 | 0 |
| 6-16 | 0 | 0 | 0 |
| 6-17 | 0 | 0 | 0 |
| 6-18 | 20 | 0 | 80 |
| 6-19 | 30 | 0 | 70 |

Table 12-2

| No | Cu content in metal of internal electrode (% by weight) | Ni content in metal of internal electrode (% by weight) | Ratio (%) of change in amount of displacement after continuous operation to the initial state = Degree of deterioration (%) |
|---|---|---|---|
| 6-1 | 0 | 0 | Destroyed due to migration. |
| 6-2 | 0 | 0 | 0.70 |
| 6-3 | 0 | 0 | 0.70 |
| 6-4 | 0 | 0 | 0.40 |
| 6-5 | 0 | 0 | 0.20 |
| 6-6 | 0 | 0 | 0.20 |
| 6-7 | 0 | 0 | 0.00 |
| 6-8 | 0 | 0 | 0.00 |
| 6-9 | 0 | 0 | 0.00 |
| 6-10 | 0 | 0 | 0.00 |
| 6-11 | 0 | 0 | 0.20 |
| 6-12 | 0 | 0 | 0.20 |
| 6-13 | 0 | 0 | 0.40 |
| 6-14 | 0 | 0 | 0.70 |
| 6-15 | 99.9 | 0.1 | 0.00 |
| 6-16 | 100 | 0 | 0.20 |
| 6-17 | 0 | 100 | 0.40 |
| 6-18 | 0 | 0 | 1.10 |
| 6-19 | 0 | 0 | 1.10 |

Table 12 shows that the multi-layer piezoelectric actuator of sample No. 6-1 was damaged by silver migration that occurred because the internal electrode 12 was formed from 100% silver, thus making it difficult to carry out the continuous operation.

Metal compounds in the internal electrodes 12 of samples Nos. 6-18 and 6-19 contained more than 15% by weight of group VIII metal and less than 85% by weight of group Ib metal, resulting in increasing deterioration during continuous operation and decreasing durability of the multi-layer piezoelectric actuator.

Metal compounds in the internal electrodes 12 of samples Nos. 6-2 through 6-15 were controlled so that proportion M1 (% by weight) of the group VIII metal and proportion M2 (% by weight) of the group Ib metal satisfy the relations $0<M1\leq15$, $85\leq M2<100$ and $M1+M2=100$. This enabled it to decrease the specific resistance of the internal electrode 12 and suppress heat from being generated from the internal electrode 12 even when operated continuously, thus achieving the multi-layer piezoelectric actuator having the amount of displacement of the device being stabilized after continuous operation.

In samples Nos. 6-15 through 6-17, the internal electrodes 12 were formed by using Ni as the group VIII metal and Cu as the group Ib metal as the main component, and therefore specific resistance of the internal electrode 12 could be kept low so as to suppress heat from being generated from the internal electrode 12 even when operated continuously, thus achieving the multi-layer piezoelectric actuator having the amount of displacement of the device being stabilized after continuous operation.

The present invention is not limited to the Examples described above, and various modifications may be made within the scope of the present invention.

Example 7

Predetermined quantities of stock materials are weighed so as make a sintered material having composition of $Pb_{1-x}Ba_x$ $(Zn_{1/3}Nb_{2/3})_a(Yb_{1/2}Nb_{1/2})_b(Co_{1/3}Nb_{2/3})_c(Fe_{2/3}W_{1/3})_d Nb_e$ $[Zr_{0.48}Ti_{0.52}]_{1-a-b-c-d-e}O_3$ (x, a, b, c, d and e are values smaller than 1), and predetermined quantity of $SiO_2$ is weighed. While the stock material contains $SiO_2$ as the impurity, materials that include as less impurity as possible are used. After mixing the materials in wet process in a ball mill for 18 hours, the mixture is calcined at 900° C. for 2 hours. The calcined material is then crushed in wet process by means of ball mill or the like.

The crushed material was mixed with an organic binder and a plasticizer to form a slurry which was formed into green sheets having thickness of 150 μm by the slip casting process.

An electrically conductive paste formed from 90% by weight of Ag and 10% by weight of Pd was applied to the green sheet by screen printing method to a thickness of 4 μm and dried. Then 20 pieces (200 pieces when measuring piezoelectric strain constant $d_{33}$) of the green sheets having the electrode films formed thereon were stacked, and 10 pieces of green sheets without electrically conductive paste formed thereon were stacked on both ends of the stack in the stacking direction.

The stack was pressurized while heating to 100° C. so as to consolidate the stack, and was cut into 10 mm square shape. The stack thus cut into the predetermined dimensions iwa heated to 800° C. for 10 hours to remove the binder, then fired at 1000° C. thereby to make the column-like stack indicated as 1a. Grooves measuring 100 μm in depth and 50 μm in width in the stacking direction were formed on one side face of the multi-layer piezoelectric device in one layer and on the other face of the multi-layer piezoelectric device in the next layer and so on, in a staggered configuration, and the grooves were filled with silicone rubber as an insulator.

Then an electrically conductive thermosetting material was formed in a band shape as the external electrode on the other end of the electrode that is not insulated, and was subjected to heat treatment at 200° C. Lead wires were connected to the positive external electrode and the negative external electrode. After coating the circumferential surface of the multi-layer piezoelectric device with silicon rubber by dipping, a voltage of 1 kV was applied so as to apply polarization treatment to the multi-layer piezoelectric device as a whole, thereby making the multi-layer piezoelectric device of the present invention as shown in FIG. 4. Amount of displacement of the multi-layer piezoelectric device under voltage from 0 to 200 V and piezoelectric strain constant $d_{33}$ were measured. The amount of displacement was measured by securing the sample, that was lined with an aluminum foil on the top surface thereof, on a vibration-proof bench, applying voltages from 0 to 200 V to the sample, and averaging the values measured at the center and three points along the periphery of the device by a laser displacement meter. Piezoelectric strain constant $d_{33}$ was calculated from the number of stacked layers n=200, displacement ΔL and applied voltage V=200 V using the equation $d_{33}=\Delta L/n \cdot V$.

Si content was quantitatively determined by ICP mass spectroscopy with capability of measuring on ppm order. Thickness of the grain boundary layer was determined from TEM image.

Tendency of grains to fall off was determined by applying ultrasonic cleaning to the device in pure water for 10 minutes and observing the surface with a metallurgical microscope thereafter.

Chronic change in the insulation resistance was determined by measuring the time before the leakage current increases reaching insulation breakdown in HALT test (Highly Accelerated Life Testing). The test was conducted in ambient temperature of 300° C. with electric field of 2 kV/mm.

The results are shown in Table 13.

TABLE 13

Table 13-1

| Sample No. | 1 − x (mol) | x (mol) | a (mol) | b (mol) | c (mol) | d (mol) | e (mol) | 1 − a − b − c − d − e (mol) |
|---|---|---|---|---|---|---|---|---|
| *7-1 | 0.95 | 0.05 | 0.08 | 0.04 | 0.04 | 0.03 | 0.005 | 0.805 |
| 7-2 | 0.95 | 0.05 | 0.08 | 0.04 | 0.04 | 0.03 | 0.005 | 0.805 |
| 7-3 | 0.95 | 0.05 | 0.08 | 0.04 | 0.04 | 0.03 | 0.005 | 0.805 |
| 7-4 | 0.95 | 0.05 | 0.08 | 0.04 | 0.04 | 0.03 | 0.005 | 0.805 |
| 7-5 | 0.95 | 0.05 | 0.08 | 0.04 | 0.04 | 0.03 | 0.005 | 0.805 |
| 7-6 | 0.95 | 0.05 | 0.08 | 0.04 | 0.04 | 0.03 | 0.005 | 0.805 |
| 7-7 | 0.95 | 0.05 | 0.08 | 0.04 | 0.04 | 0.03 | 0.005 | 0.805 |
| *7-8 | 0.95 | 0.05 | 0.08 | 0.04 | 0.04 | 0.03 | 0.005 | 0.805 |
| *7-9 | 0.95 | 0.05 | 0.08 | 0.04 | 0.04 | 0.03 | 0.005 | 0.805 |
| *7-10 | 0.955 | 0.045 | 0.085 | 0.04 | 0.05 | 0.025 | 0.005 | 0.795 |
| *7-11 | 0.955 | 0.045 | 0.085 | 0.04 | 0.05 | 0.025 | 0.005 | 0.795 |
| 7-12 | 0.955 | 0.045 | 0.085 | 0.04 | 0.05 | 0.025 | 0.005 | 0.795 |
| 7-13 | 0.955 | 0.045 | 0.085 | 0.04 | 0.05 | 0.025 | 0.005 | 0.795 |
| 7-14 | 0.955 | 0.045 | 0.085 | 0.04 | 0.05 | 0.025 | 0.005 | 0.795 |
| *7-15 | 0.955 | 0.045 | 0.085 | 0.04 | 0.05 | 0.025 | 0.005 | 0.795 |

Table 13-2

| No. | Si content (ppm) | d33 (pm/V) | Time before insulation breakdown (Hr) | Grain fall-off resistance | Thickness of grain boundary layer (nm) |
|---|---|---|---|---|---|
| *7-1 | 150 | 802 | 63 | ○ | 1.1 |
| 7-2 | 90 | 810 | 110 | ○ | 0.8 |
| 7-3 | 70 | 814 | 114 | ○ | 0 |
| 7-4 | 50 | 806 | 123 | ○ | 0 |
| 7-5 | 30 | 812 | 130 | ○ | 0 |
| 7-6 | 10 | 801 | 126 | ○ | 0 |
| 7-7 | 5 | 793 | 129 | ○ | 0 |
| *7-8 | 3 | 790 | 124 | x | 0 |
| *7-9 | 0 | 790 | 118 | x | 0 |
| *7-10 | 200 | 760 | 32 | ○ | 1.4 |
| *7-11 | 100 | 755 | 56 | ○ | 1.1 |
| 7-12 | 90 | 758 | 102 | ○ | 0.4 |
| 7-13 | 50 | 753 | 100 | ○ | 0 |
| 7-14 | 10 | 740 | 106 | ○ | 0 |
| *7-15 | 0 | 734 | 103 | x | 0 |

As can be seen from Table 13, thickness of the grain boundary layer exceeded 1 nm and insulation breakdown occurred earlier in samples Nos. 7-1, 7-10 and 7-11 where 100 ppm or more Si content was contained. In samples Nos. 7-8, 7-9 and 7-15 where Si content was less than 5 ppm, grain fall-off resistance was low and fall-off of grains was observed after machining or ultrasonic cleaning. It can be seen that thickness of the grain boundary layer becomes 1 nm or less and the volumetric specific resistance did not change over a long period of time and insulation breakdown is not less likely to occur even when a voltage is applied, in case Si content was in a range from 5 ppm to 100 ppm, which was within the scope of the present invention.

In the manufacturing method described above, predetermined amount of $SiO_2$ is added because it makes it easier to control the composition. However, a starting material that includes much Si content as impurity may be used without intentionally adding $SiO_2$, if Si content in the piezoelectric ceramic material after sintering can be controlled in a range from 5 ppm or more and less than 100 ppm.

INDUSTRIAL APPLICABILITY

The multi-layer piezoelectric device of the present invention can be used and has excellent durability in continuous operation over a long period of time under a high voltage and a high pressure, as described so far, and provides very high value of industrial utility for applications in harsh operating environment such as fuel injection apparatus for automobile.

The invention claimed is:

1. A multi-layer piezoelectric device made by stacking piezoelectric layers and internal electrodes alternately one on another, wherein the piezoelectric layer contains $PbTiO_3$—$PbZrO_3$ as a main component and contains Si of not less than 5 ppm and less than 100 ppm;
    wherein the grain boundary has single molecules of $SiO_2$ and has no glass phase containing $SiO_2$.
2. The multi-layer piezoelectric device according to 1; wherein Si is segregated in the crystal grain boundary and thickness of the grain boundary is not larger than 1 nm.

* * * * *